United States Patent
Mori

(10) Patent No.: US 11,038,051 B2
(45) Date of Patent: Jun. 15, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Takahiro Mori, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/782,823

(22) Filed: Feb. 5, 2020

(65) Prior Publication Data

US 2020/0259016 A1 Aug. 13, 2020

(30) Foreign Application Priority Data

Feb. 8, 2019 (JP) .............................. JP2019-021292

(51) Int. Cl.
| | |
|---|---|
| *H01L 29/78* | (2006.01) |
| *H01L 29/10* | (2006.01) |
| *H01L 29/66* | (2006.01) |
| *H01L 29/08* | (2006.01) |
| *H01L 29/423* | (2006.01) |

(52) U.S. Cl.
CPC ........ *H01L 29/7816* (2013.01); *H01L 29/086* (2013.01); *H01L 29/0878* (2013.01); *H01L 29/1083* (2013.01); *H01L 29/66681* (2013.01); *H01L 29/7835* (2013.01); *H01L 29/4236* (2013.01); *H01L 29/66704* (2013.01)

(58) Field of Classification Search
CPC ............. H01L 29/7816; H01L 29/0878; H01L 29/086; H01L 29/1095; H01L 29/0653; H01L 29/1083; H01L 29/0692; H01L 29/1045; H01L 29/66681; H01L 29/7835
See application file for complete search history.

(56) References Cited

U.S. PATENT DOCUMENTS

2004/0201061 A1* 10/2004 Jeon .................... H01L 29/7809
257/335
2010/0314683 A1 12/2010 Yanagi
(Continued)

FOREIGN PATENT DOCUMENTS

| JP | 2011-003608 A | 1/2011 |
|---|---|---|
| JP | 2013-115166 A | 6/2013 |
| JP | 2017-152559 A | 8/2017 |

*Primary Examiner* — Errol V Fernandes
*Assistant Examiner* — Jeremy J Joy
(74) *Attorney, Agent, or Firm* — McDermott Will & Emery LLP

(57) ABSTRACT

A semiconductor device includes a semiconductor substrate including a first epitaxial layer having a first surface and a second surface, a second epitaxial layer, a buried region formed across the first epitaxial layer and the second epitaxial layer, and a gate electrode. The second epitaxial layer includes a drain region, a source region, a body region, a drift region, a first region, and a second region. The first region is formed below at least the drain region. The second region has first and second ends in a channel length direction. The first end is located between the body region and the drain region in the channel length direction. The second region extends from the first end toward the second end such that the second end extends below at least the source region. An impurity concentration of the second region is greater than an impurity concentration of the first region.

10 Claims, 30 Drawing Sheets

(56) References Cited

U.S. PATENT DOCUMENTS

| | | | |
|---|---|---|---|
| 2012/0187484 A1* | 7/2012 | Cho | H01L 29/1087 257/339 |
| 2013/0134510 A1* | 5/2013 | Yanagi | H01L 29/0649 257/337 |
| 2017/0025532 A1* | 1/2017 | Mori | H01L 29/7835 |
| 2017/0250259 A1* | 8/2017 | Mori | H01L 21/26513 |
| 2017/0323938 A1* | 11/2017 | Chen | H01L 29/1087 |
| 2018/0151410 A1* | 5/2018 | Usami | H01L 21/823871 |
| 2018/0342577 A1* | 11/2018 | Fujii | H01L 29/0646 |
| 2020/0006502 A1* | 1/2020 | Cai | H01L 29/7816 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-021292 filed on Feb. 8, 2019 including the specification, drawings and abstract is incorporated herein by reference in its entirety.

BACKGROUND

The present disclosure relates to semiconductor device and method of manufacturing the semiconductor device.

There are disclosed techniques listed below.

[Patent Document 1] Japanese Unexamined Patent Application Publication No. 2017-152559

[Patent Document 2] Japanese Unexamined Patent Application Publication No. 2011-3608

[Patent Document 3] Japanese Unexamined Patent Application Publication No. 2013-115166

Patent Document 1 describes a semiconductor device including a LDMOS transistor.

The semiconductor device disclosed in Patent Document 1 includes a semiconductor substrate, a gate dielectric film, and a gate electrode. The semiconductor substrate includes a support substrate, an epitaxial layer formed on the support substrate, and a buried region. A conductivity type of the support substrate and a conductivity type of the epitaxial layer are p-type. The buried region is formed across the support substrate and the epitaxial layer. a conductivity type of the buried region is n-type.

The epitaxial layer has a first surface and a second surface. The first surface is a surface of the epitaxial layer on the supporting substrate side. The second surface is an opposing surface of the first surface. The second surface is a main surface of the semiconductor substrate. In the epitaxial layer, a source region, a drain region, a well region, a drift region, a first region, and a second region are formed.

The source region is formed on the second surface. The drain region is formed on the second surface and is spaced away from the source region. The well region is formed on the second surface such that the well region surrounds the source region. The drift region is formed on the second surface such that the drift region surrounds the drain region. The conductivity type of the source region, the drain region, and the drift region is n-type, and the conductivity type of the well region is p-type. Hereinafter, the second surface between the source region and the drift region is a channel region.

The first region is located below the drain region. The second region has one end and the other end in a channel length direction (a direction from the source region toward the drain region). One end of the second region is located between a body region and the drain region in the channel length direction. The other end of the second region is located below the source region. The first region is located between the drain region and the first surface in a thickness direction (a direction from the first surface toward the second surface). The second region is located farther from the first surface than the first region in the thickness direction. The conductivity type of the first region and the second region is p-type. An impurity concentration of the second region is greater than an impurity concentration of the first region.

The gate electrode faces the channel region while the gate electrode is insulated with gate dielectric film. The source region, the drain region, the well region, the drift region, the gate dielectric film and the gate electrode constitute an LDMOS transistor.

Patent Document 2 and Patent Document 3 also respectively disclose a semiconductor device in which a LDMOS transistor is formed.

SUMMARY

In the semiconductor device disclosed in Patent Document 1, the on-state breakdown voltage of the LDMOS transistor can be improved by the second region. The semiconductor device of Patent Document 1 includes a parasitic npn transistor having a drain region as a collector, a well region as a base, and a source region as an emitter. In the semiconductor device described in Patent Document 1, because the second region is located farther from the first surface than the first region, a rise of a potential of the well region due to the potential of the buried region cannot be sufficiently suppressed. When the potential of the well region rises, the parasitic npn transistor operates and the on-state breakdown voltage is lowered, so that there is a room for improving the on-state resistance of the LDMOS in the semiconductor device disclosed in Patent Document 1.

Other problems and novel features will become apparent from the description of this specification and the accompanying drawings.

A semiconductor device according to embodiments includes: a first epitaxial layer of a first conductivity type having a first surface and a second surface opposite to the first surface; a second epitaxial layer of the first conductivity type formed on the second surface, and having a third surface facing the second surface and a fourth surface opposite to the third surface; a buried region of the second conductivity type opposite to the first conductivity type, formed across the first epitaxial layer and the second epitaxial layer; and a gate electrode. The second epitaxial layer includes a drain region, a source region, a body region, a drift region, a first region, and a second region. The drain region is formed on the fourth surface. The source region is formed on the fourth surface spaced apart from the drain region. The drift region is formed on the fourth surface such that the drift region surrounds the drain region. The body region is formed in the fourth surface such that the body region surrounds the source region. The first region is formed at a position closer to the buried region than the drift region in the thickness direction which is a direction from the third surface toward the fourth surface. The second region is formed at a position closer to the buried region than the first region in the thickness direction. The conductivity type of the body region, the first region, and the second region is the first conductivity type. The conductivity type of the drain region, the source region, and the drift region is second conductivity type. The first region is formed below at least the drain region. The second region has a first end and a second end opposite to the first end, in the channel length direction from the source region toward the drain region. The first end is located between the body region and the drain region in the channel length direction. The second region extends from the first end toward the second end such that the second end reaches below at least the source region. An impurity concentration of the second region is greater than an impurity concentration of the first region. The gate electrode faces the fourth surface between the source region and the drift region, while being insulated.

According to the semiconductor device according to the embodiments, the on-state breakdown voltage of the LDMOS transistor can be improved.

DETAILED DESCRIPTION

Figure 1:
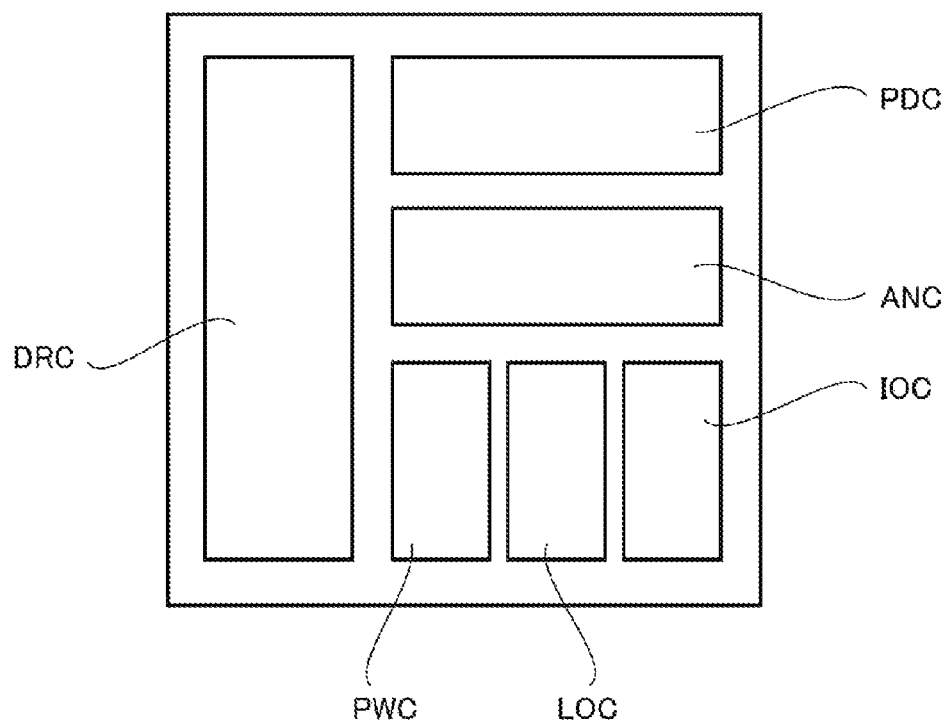
FIG. 1 is a schematic diagram showing a circuit configuration of a semiconductor device according to a first embodiment.

Details of the embodiments will be described with reference to the drawings. In the following drawings, the same or corresponding components are denoted by the same reference numerals, and the description thereof will not be repeated.

First Embodiment

Hereinafter, a semiconductor device according to a first embodiment will be described.

Circuit Configuration of Semiconductor Device According to First Embodiment

As shown in FIG. 1, the semiconductor device according to the first embodiment includes, for example, a driver circuit DRC, a pre-driver circuit PDC, an analogue circuit ANC, a power supply circuit PWC, and an input/output circuit IOC. Among these, for example, the driver circuit DRC includes a transistor Tr. The transistor Tr is a LDMOS transistor.

Figure 2:
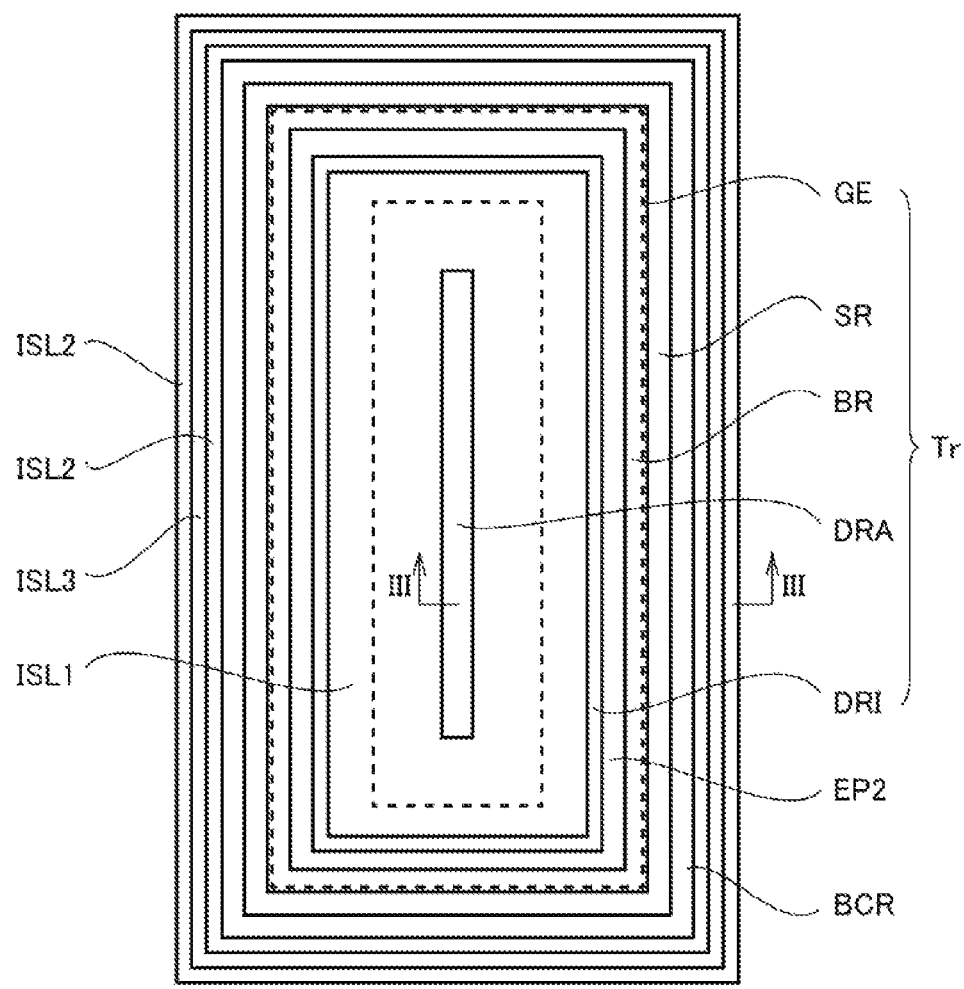
FIG. 2 is a plan view of the semiconductor device according to the first embodiment.
Figure 3:
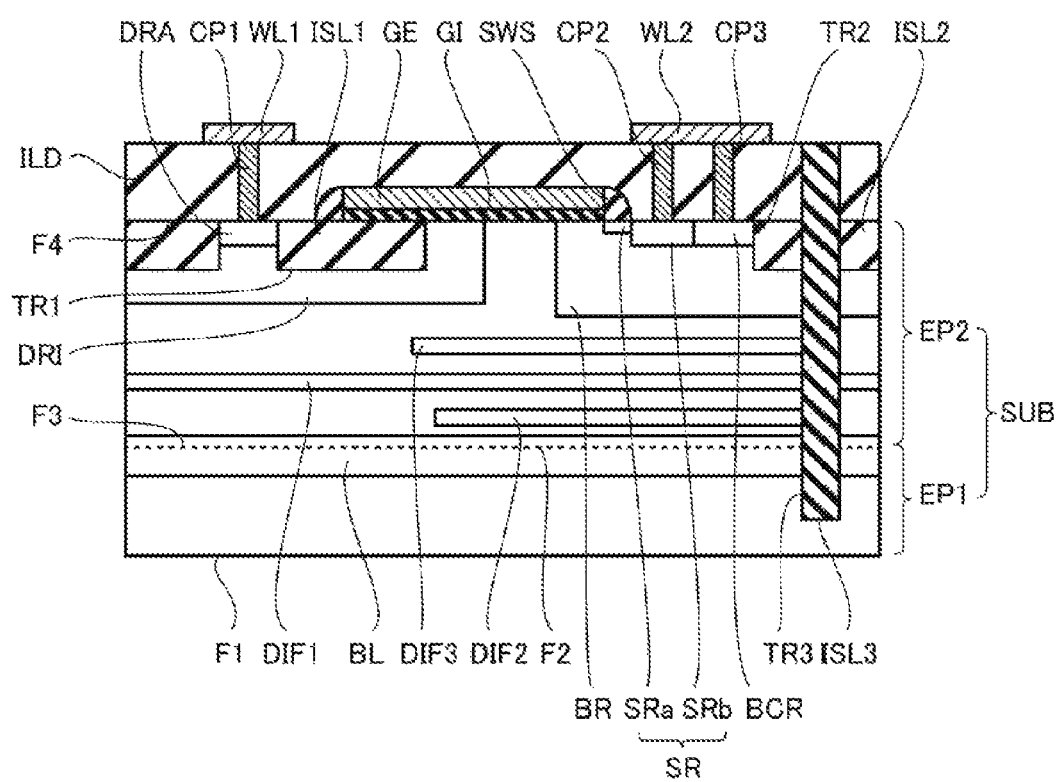
FIG. 3 is a cross-sectional view taken along a III-III line in FIG. 2.

Configuration of LDMOS Transistor in Semiconductor Device According to First Embodiment As shown in FIGS. 2 and 3, the semiconductor device according to the first embodiment includes a semiconductor substrate SUB, an insulating isolation film ISL1 and an insulating isolation film ISL2, a gate dielectric film GI, and a gate electrode GE in the region in which the transistor Tr is formed. The semiconductor device according to the first embodiment further includes a sidewall spacer SWS, an interlayer insulating film ILD, an insulating isolation film ISL3, a contact plug CP1, a contact plug CP2, a contact plug CP3, a wiring WL1, and a wiring WL2 in the region where the transistor Tr is formed.

The semiconductor substrate SUB includes an epitaxial layer EP1, an epitaxial layer EP2, and a buried region BL. The epitaxial layer EP1 and the epitaxial layer EP2 are formed of, for example, single-crystal silicon (Si) doped with an impurity. The conductivity type of the epitaxial layer EP1 and the epitaxial layer EP2 is the first conductivity type. The first conductivity type is, for example, p-type. The epitaxial layer EP1 has a first surface F1 and a second surface F2. The second surface F2 is an opposing surface of the first surface F1. The epitaxial layer EP2 has a third surface F3 and a fourth surface F4. The fourth surface F4 is an opposing surface of the third surface F3.

The epitaxial layer EP2 is formed on the epitaxial layer EP1. More specifically, the epitaxial layer EP2 is formed on the second surface F2. The third surface F3 is opposed to the second surface F2. That is, the fourth surface F4 constitutes a main surface of the semiconductor substrate SUB.

The buried region BL is formed across the epitaxial layer EP1 and the epitaxial layer EP2. A conductivity type of the buried region BL is second conductivity type. The second conductivity type is the opposite conductivity type of the first conductivity type. That is, if the first conductivity type is p-type, the second conductivity type is n-type. The epitaxial layer EP1 and the epitaxial layer EP2 are electrically isolated from each other by the buried region BL.

A drain region DRA, a source region SR, a drift region DRI, a body region BR and a body contact region BCR are formed in the epitaxial layer EP2.

The drain region DRA is formed in the fourth surface F4. The source region SR is formed on the fourth surface F4 spaced away from the drain region DRA. The source region SR has a first portion SRa and a second portion SRb. The first portion SRa is located closer to the drain region DRA than the second portion SRb. An impurity concentration of the first portion SRa is smaller than an impurity concentration of the second portion SRb. In other words, the source region SR has a Lightly Doped Diffusion (LDD) structure. The conductivity type of the drain region DRA and the source region SR is the second conductivity type.

The drift region DRI is formed on the fourth surface F4 such that the drift region DRI surrounds the drain region DRA. The conductivity type of the drift region DRI is the second conductivity type. The impurity concentration of the drift region DRI is smaller than the impurity concentration of the drain region DRA.

The body region BR is formed on the fourth surface F4 such that the body region BR surrounds the source region SR. The conductivity type of the body region BR is a first conductivity type. An impurity concentration of the body regions BR is greater than an impurity concentration of the epitaxial layers EP2.

The body contact region BCR is formed on the fourth surface F4. The body contact region BCR is disposed adjacent to the source region SR on the side opposite to the drain region DRA. Body contact region BCR is surrounded by body region BR. The conductivity type of the body contact region BCR is a first conductivity type. An impurity concentration of the body contact region BCR is greater than an impurity concentration of the body region BR.

A trench TR1 is formed on the fourth surface F4. The trench TR1 extends from the fourth surface F4 toward the third surface F3. The trench TR1 is located between the drain region DRA and the source region SR such that the trench TR1 is surrounded by the drift region DRI. The insulating isolation film ISL1 is buried in the trench TR1. The insulating isolation film ISL1 is formed of, for example, silicon oxide ($SiO_2$). The trench TR1 and the insulating isolation film ISL1 have Shallow Trench Isolation (STI) structure. The insulating isolation film ISL1 (the trench TR1) is formed such that the insulating isolation film ISL1 surrounds the drain region DRA in a plan view (see FIG. 2). The insulating isolation film ISL1 may be Local Oxidation Of Silicon (LOCOS).

A trench TR2 is formed on the fourth surface F4. The trench TR2 is located next to the body contact region BCR on the other side than the source region SR. The trench TR2 extends from the fourth surface F4 toward the third surface F3. The trench TR2 is surrounded by the body region BR. The insulating isolation film ISL2 is buried in the trench TR2. The insulating isolation film ISL2 is formed of, for example, silicon oxide. The trench TR2 and the insulating isolation film ISL2 has STI structure. The insulating isolation film ISL2 (the trench TR2) is formed such that the insulating isolation film ISL2 surrounds the body contact region BCR in plan view. The insulating isolation film ISL2 may be LOCOS.

The gate dielectric film GI is formed on the fourth surface F4 between the source region SR and the trench TR1. The gate dielectric film GI is formed of, for example, silicon oxide.

The gate electrode GE is formed on the gate dielectric film GI. The gate electrode GE may extend over the insulating isolation film ISL1. The gate electrode GE faces the channel region (the fourth surface F4 disposed between the source region SR and the drift region DRI) while being insulated from the channel region by the gate dielectric film GI. The gate electrode GE is formed of, for example, polycrystalline silicon doped with impurities.

The drain region DRA, the source region SR, the drift region DRI, the body region BR, the gate dielectric film GI, and the gate electrode GE constitute a transistor Tr.

The side wall spacer SWS is formed on the first portion SRa such that the side wall spacer SWS contacts with the first side surface of the gate electrode GE. The side wall spacer SWS is formed on the insulating isolation film ISL1 such that the side wall spacer SWS contacts with the second side surface of the gate electrode GE. The second side surface is a side surface of the gate electrode GE opposite to the first side surface of the gate electrode GE. The sidewall spacer SWS is formed of, for example, a laminated film of silicon oxide and silicon nitride ($Si_3N$).

The interlayer insulating film ILD is formed on the fourth surface F4 such that the interlayer insulating film ILD covers the gate electrode GE and the sidewall spacer SWS. The interlayer insulating film ILD is formed of, for example, silicon oxide.

A trench TR3 is formed in the interlayer insulating film ILD, the semiconductor substrate SUB, and the insulating isolation film ISL2. The trench TR3 extends from the fourth surface F4 toward the first surface F1 in the semiconductor substrate SUB. The trench TR3 is formed such that the trench TR3 penetrates the buried region BL. From another viewpoint, the interlayer insulating film ILD, the insulating isolation film ISL2, the body region BR, the epitaxial layer EP2, the buried region BL, and the epitaxial layer EP1 are exposed from the side surface of the trench TR3. The insulating isolation film ISL3 is buried in the trench TR3. The insulating isolation film ISL3 is formed of, for example, silicon oxide. The trench TR3 and the insulating isolation film ISL3 are formed in a Deep Trench Isolation (DTI) structure. The insulating isolation film ISL3 (the trench TR3) is formed such that the insulating isolation film ISL3 surrounds the transistor Tr in a plan view.

The contact plug CP1, the contact plug CP2 and the contact plug CP3 are formed in the interlayer insulating film ILD. More specifically, the contact plugs CP1, the contact plugs CP2, and the contact plug CP3 are buried in contact holes formed in the interlayer insulating film ILD. The contact plug CP1, the contact plug CP2 and the contact plug CP3 are electrically connected with the drain region DRA, the source region SR and the body contact region BCR, respectively. The contact plug CP1, the contact plug CP2, and the contact plug CP3 are formed of, for example, tungsten (W).

The wiring WL1 and the wiring WL2 are formed on the interlayer insulating film ILD. The wiring WL1 is electrically connected with the contact plug CP1, and the wiring WL2 is electrically connected with the contact plug CP2 and the contact plug CP3. The wiring WL1 and the wiring WL2 are formed of, for example, aluminum (Al) alloy, copper (Cu) alloy, or the like.

The epitaxial layer EP2 further includes a first region DIF1, a second region DIF2, and a third region DIF3 of the first region, the second region, and the third region in the semiconductor device according to the first embodiment. The conductivity type of the first region DIF1, second region DIF2 and the third region DIF3 is first conductivity type.

An impurity concentration of the second region DIF2 is greater than an impurity concentration of the first region DIF1. An impurity concentration of the third region DIF3 is greater than an impurity concentration in the first region DIF1. Preferably, the impurity concentration of the third region DIF3 is greater than the impurity concentration of the second region DIF2. The impurity concentration of the first region DIF1, the second region DIF2 and the third region DIF3 is greater than the impurity concentration of the epitaxial layer EP2.

The first region DIF1 is located closer to the third surface F3 than the drift region DRI and the body region BR in the thickness direction of the epitaxial layer EP2 (direction from the third surface F3 to the fourth surface F4). From another viewpoint, the first region DIF1 is located closer to the buried region BL than the drift region DRI and the body region BR in the thickness direction of the epitaxial layer EP2. The first region DIF1 is formed across a region where the transistor Tr is formed.

The second region DIF2 is located closer to the third surface F3 than the first region DIF1 in the thickness direction of the epitaxial layer EP2, i.e., closer to the buried region BL than the first region DIF1. The second region DIF2 has a first end and a second end in the channel length direction. The second end is the other end of the first end.

The first end of the second region DIF2 is located between the body region BR and the drain region DRA in the channel length direction. The second region DIF2 extends from the first end toward the second end such that the second end reaches the trench TR3. That is, the second region DIF2 is formed such that the second region DIF2 avoids the lower position of the drain region DRA.

The third region DIF3 is located closer to the third surface F3 (buried region BL) than the drift region DRI and the body region BR in the thickness direction of the epitaxial layer EP2, and is located further away from the third surface F3 (buried region BL) than the first region DIF1. The third region DIF3 has a first end and a second end in the channel length direction. The second end is the other end of the first end.

The first end of the third region DIF3 is located between the body region BR and the drain region DRA in the channel length direction. The third region DIF3 extends from the first end toward the second end such that the second end reaches the trench TR3. That is, the third region DIF3 is formed such that the third region DIF3 avoids the lower portion of the drain region DRA.

Figure 4:
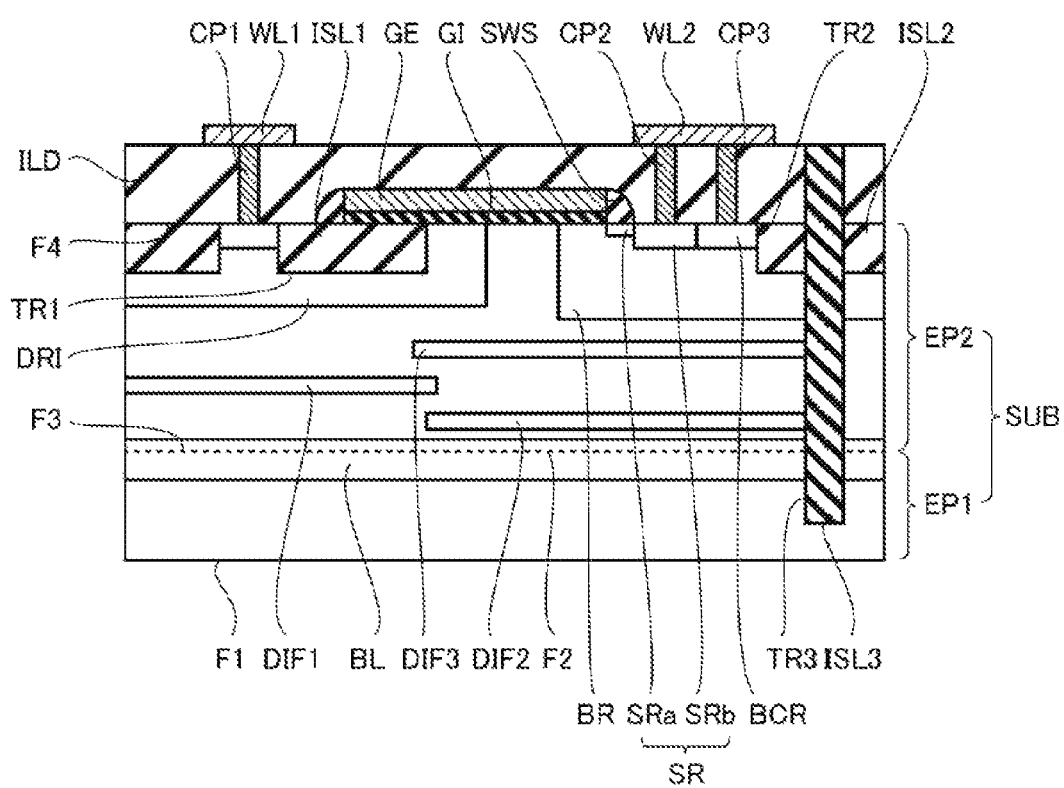
FIG. 4 is a cross-sectional view of a semiconductor device according to a first modification of the first embodiment.
Figure 5:
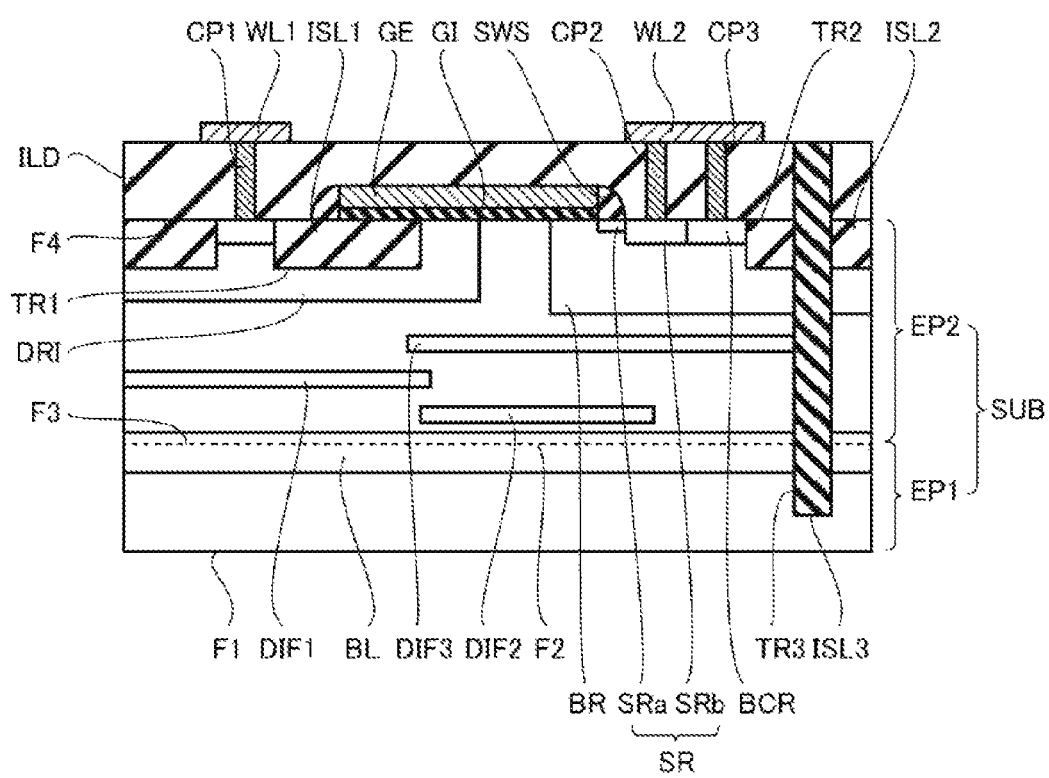
FIG. 5 is a cross-sectional view of a semiconductor device according to a second modification of the first embodiment.
Figure 6:
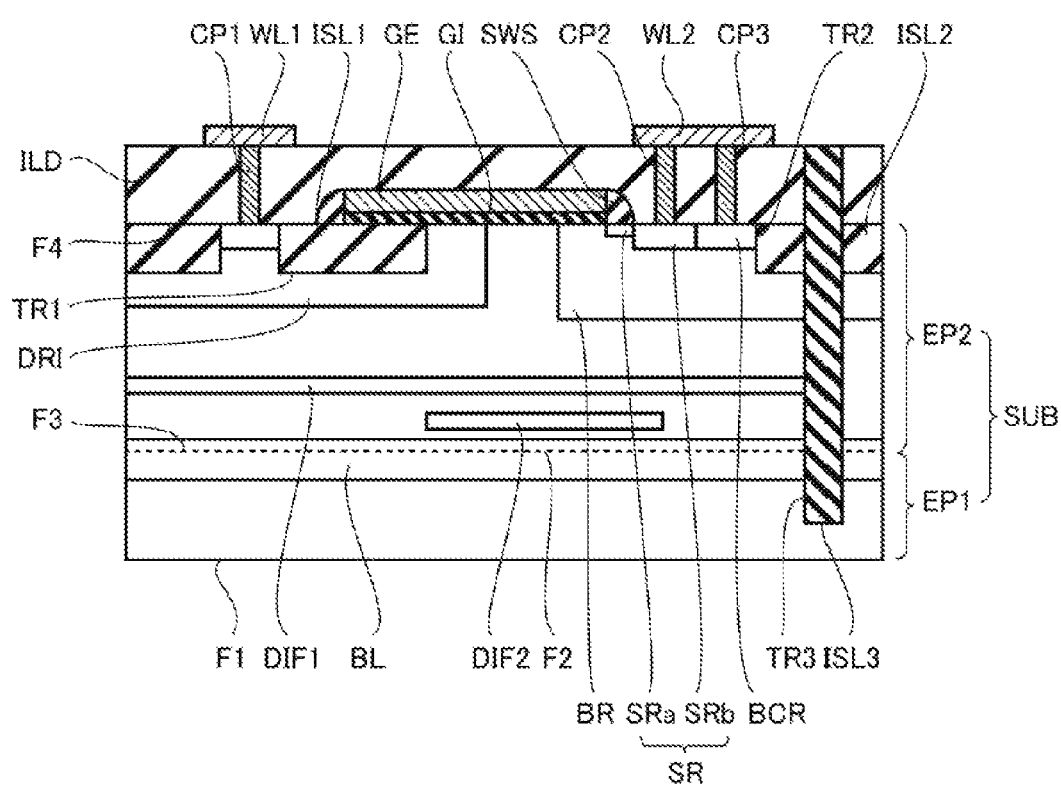
FIG. 6 is a cross-sectional view of a semiconductor device according to a third modification of the first embodiment.

As shown in FIGS. 4 to 6, the first region DIF1 may not be formed across the region where the transistor Tr is formed. More specifically, the first region DIF1 may be formed below at least the drain region DRA.

As shown in FIGS. 5 and 6, the second region DIF2 may not extend so that the second end reaches the trench TR3. More specifically, the second region DIF2 may extend from the first end so that the second end extends below at least the source region SR. From another point of view, the second region DIF2 may be formed below at least the channel region SR and the source region SR.

Figure 7:
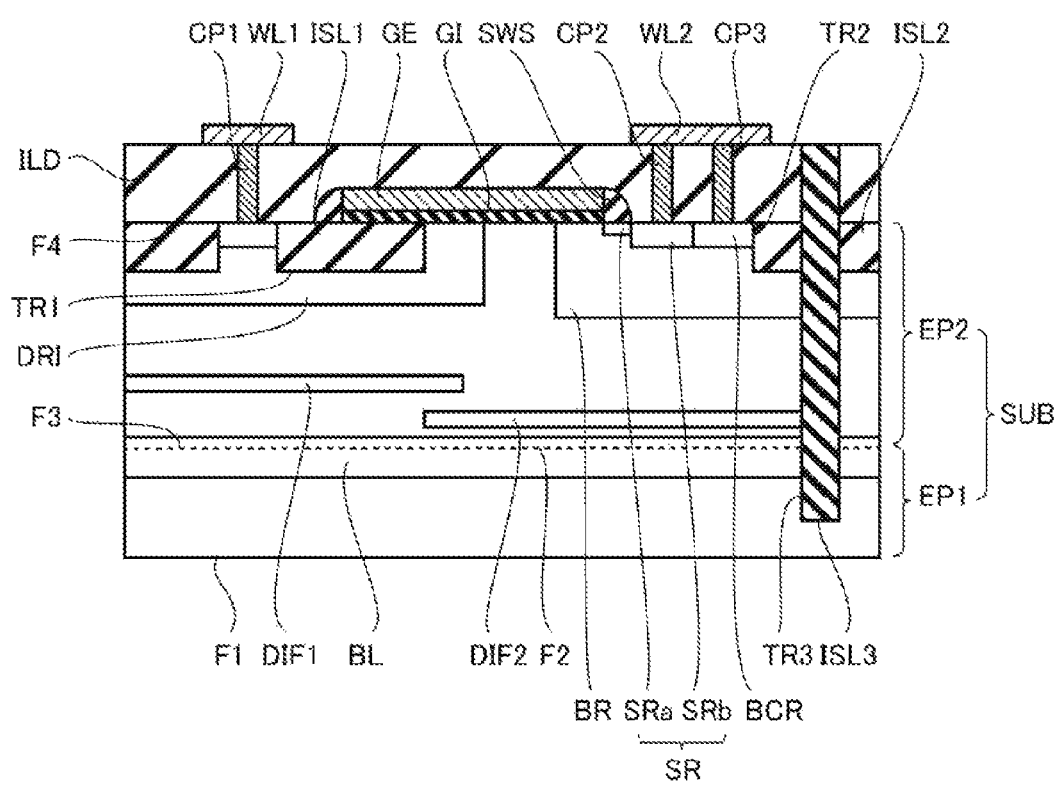
FIG. 7 is a cross-sectional view of a semiconductor device according to a fourth modification of the first embodiment.

As shown in FIGS. 6 and 7, the epitaxial layer EP2 may not include the third region DIF3.

Figure 8:
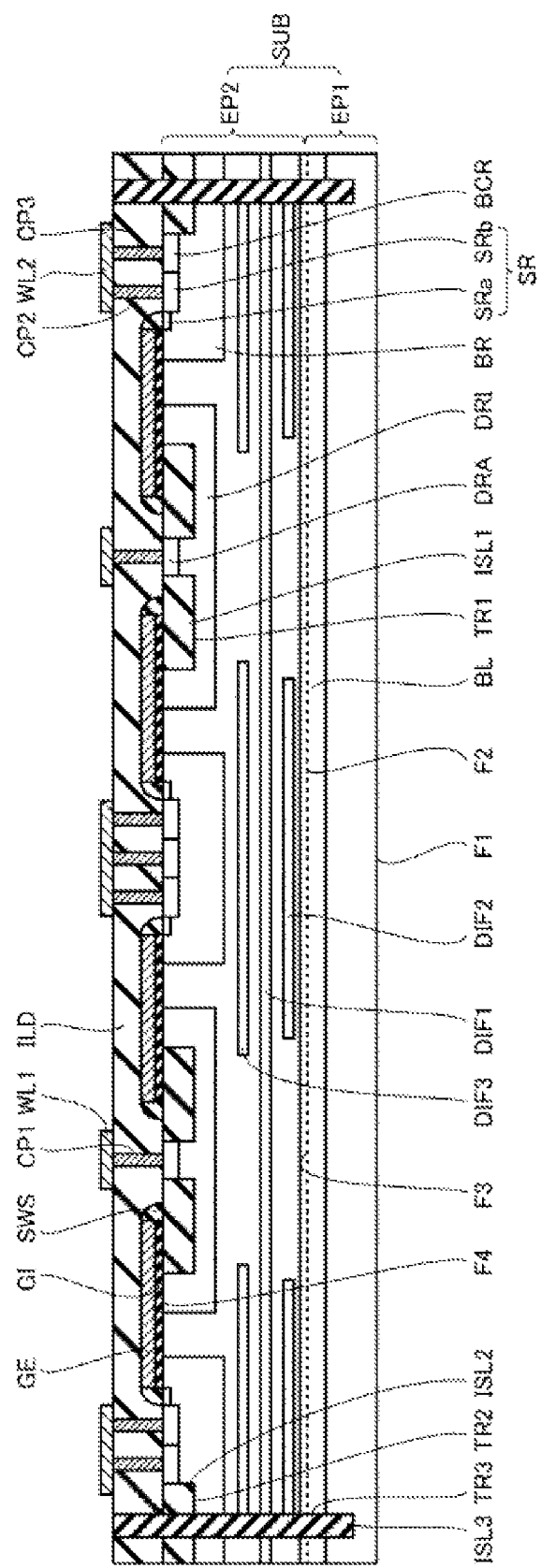
FIG. 8 is a cross-sectional view of the semiconductor device according to the first embodiment when a transistor Tr is constituted by a plurality of fingers.

In the above description, the number of fingers of the transistor Tr (LDMOS transistor) is 1, but as shown in FIG. 8, the number of fingers of the transistor Tr may be 2 or more. When the number of fingers of the transistor Tr is plural, the third region DIF3 (in FIG. 8, the third region DIF3 channel at the center) which is not arranged next to the trench TR3 may have both ends between the body region BR and the drain region DRA, respectively.

Figure 9:
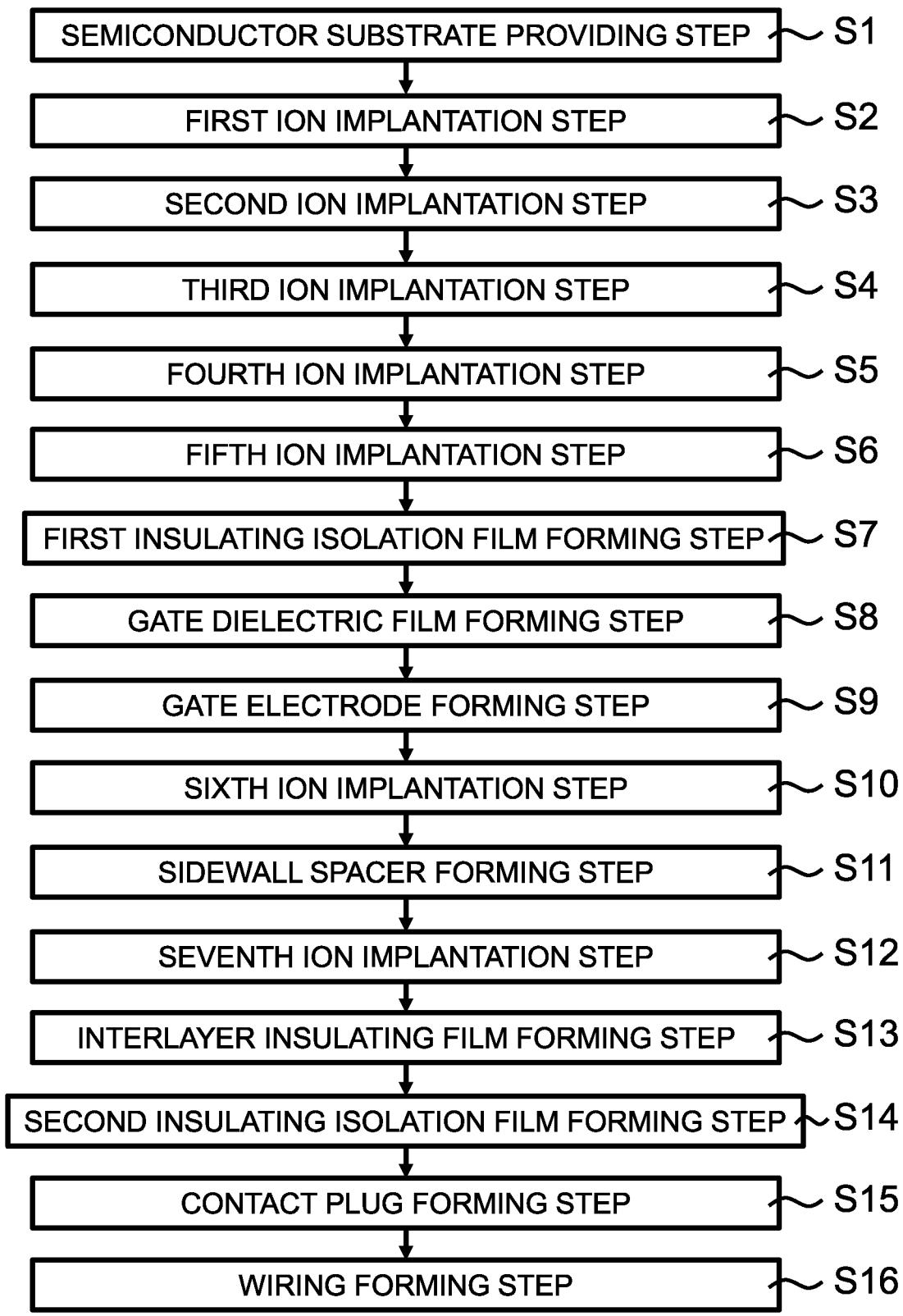
FIG. 9 is a process diagram showing a method of manufacturing the semiconductor device according to the first embodiment.

As shown in FIG. 9, the method of manufacturing the semiconductor device according to the first embodiment includes a semiconductor substrate providing step S1, a first ion implantation step S2, a second ion implantation step S3, a third ion implantation step S4, a fourth ion implantation step S5, a fifth ion implantation step S6, a first insulating isolation film forming step S7, a gate dielectric film forming step S8, and a gate-electrode forming step S9. The method of manufacturing the semiconductor device according to the first embodiment further includes a sixth ion implantation step S10, a sidewall spacer forming step S11, a seventh ion implantation step S12, an interlayer insulating film forming step S13, a second insulating isolation film forming step S14, a contact plug forming step S15, and a wiring forming step S16.

Figure 10:
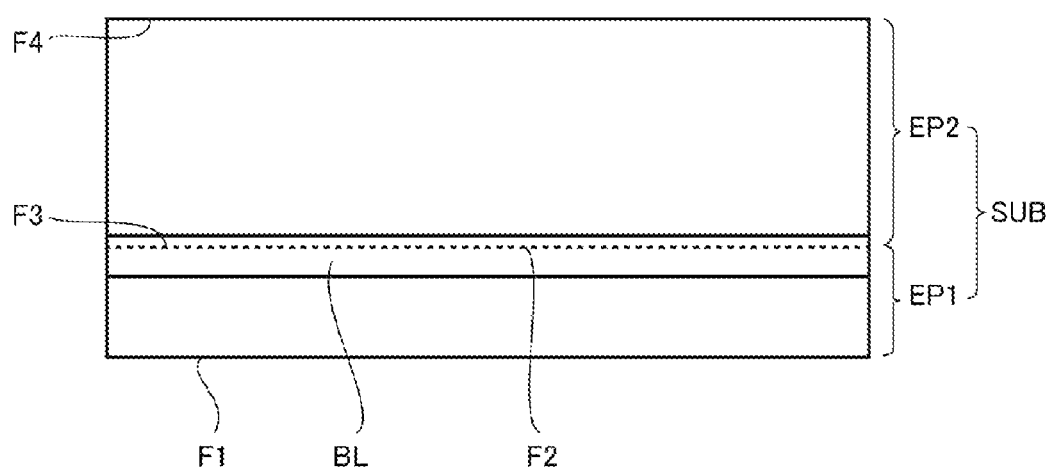
FIG. 10 is a cross-sectional view of the semiconductor device according to the first embodiment in a semiconductor substrate providing step S1.

As shown in FIG. 10, in the semiconductor substrate providing step S1, the semiconductor substrate SUBs is provided. In the semiconductor substrate providing step S1, firstly, a semiconductor substrate including the epitaxial layers EP1 is provided. In the semiconductor substrate providing step S1, second, ions implantation into the second surface F2 is performed. As a result, the buried region BL is formed. In the semiconductor substrate providing step S1, third, epitaxial growth of the epitaxial layer EP2 is performed on the epitaxial layer EP1. As described above, the semiconductor substrate SUB including the epitaxial layer EP1, the epitaxial layer EP2, and the buried region BL is provided. Incidentally, the buried region BL is finally formed across the epitaxial layer EP1 and the epitaxial layer EP2 by diffusing impurities associated with the heat treatment (and the heat treatment in the subsequent step) for forming the epitaxial layer EP2.

Figure 11:
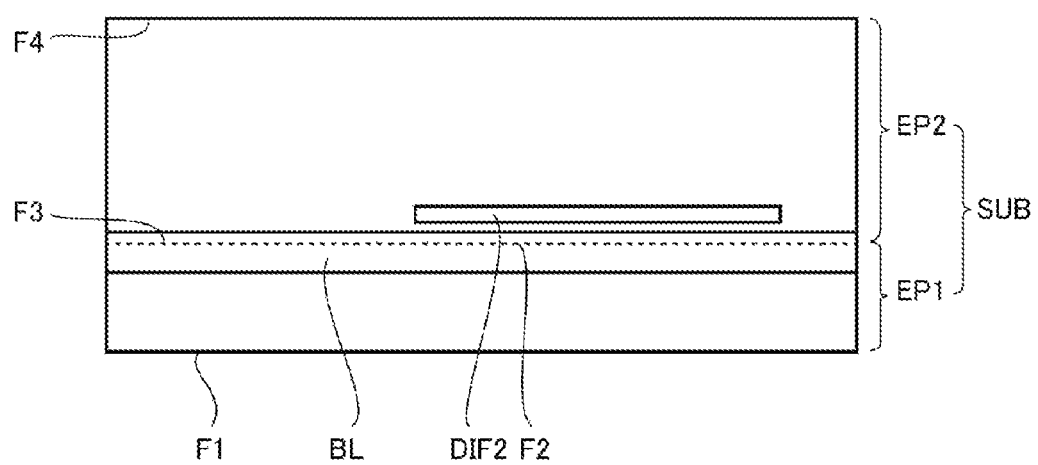
FIG. 11 is a cross-sectional view of the semiconductor device according to the first embodiment in a first ion implantation step S2.
Figure 12:
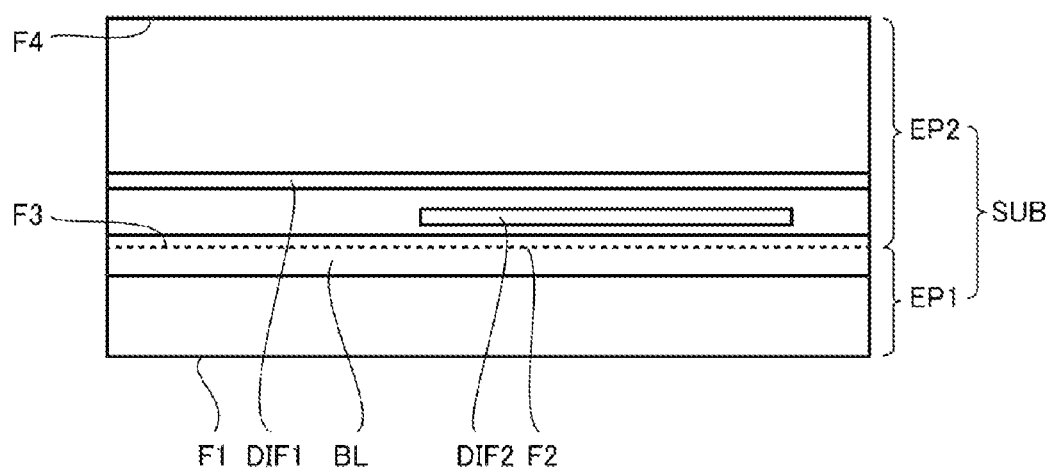
FIG. 12 is a cross-sectional view of the semiconductor device according to the first embodiment in a second ion implantation step S3.
Figure 13:
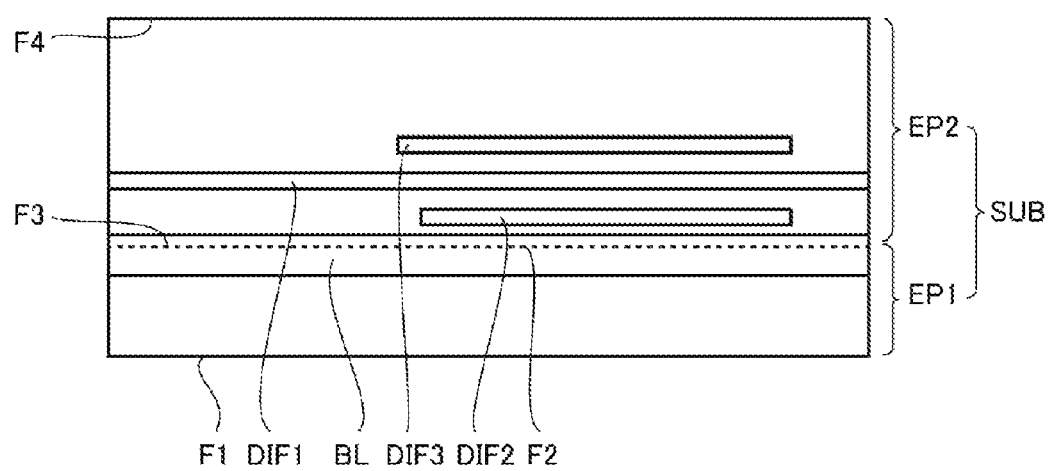
FIG. 13 is a cross-sectional view of the semiconductor device according to the first embodiment in the third ion implantation step S4.

As shown in FIG. 11, in the first ion implantation step S2, ion implantation for forming a second region DIF2 is performed. As shown in FIG. 12, in the second ion implantation step S3, ion implantation for forming the first region DIF1 is performed. As shown in FIG. 13, in the third ion implantation step S4, ion implantation for forming a third region DIF3 is performed.

Figure 14:
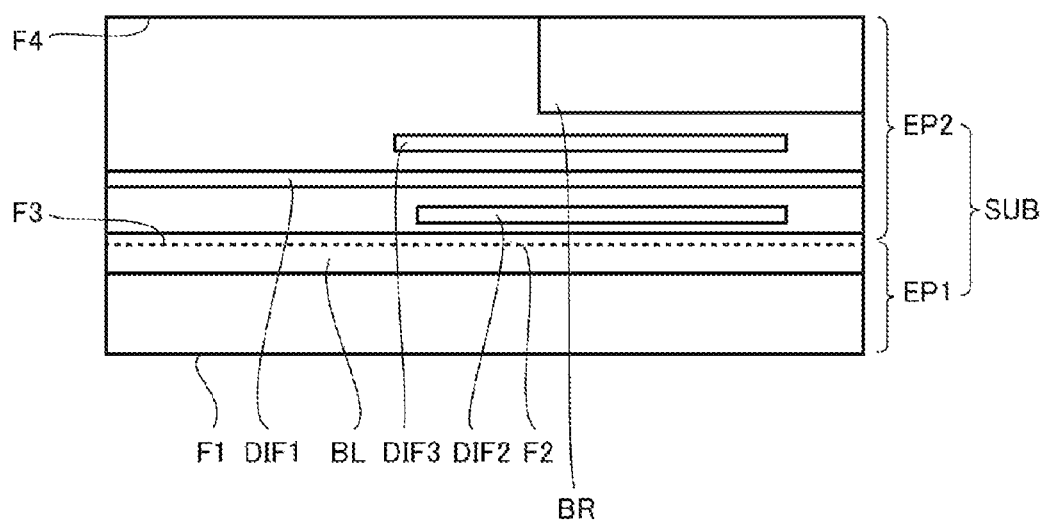
FIG. 14 is a cross-sectional view of the semiconductor device according to the first embodiment in a fourth ion implantation step S5.
Figure 15:
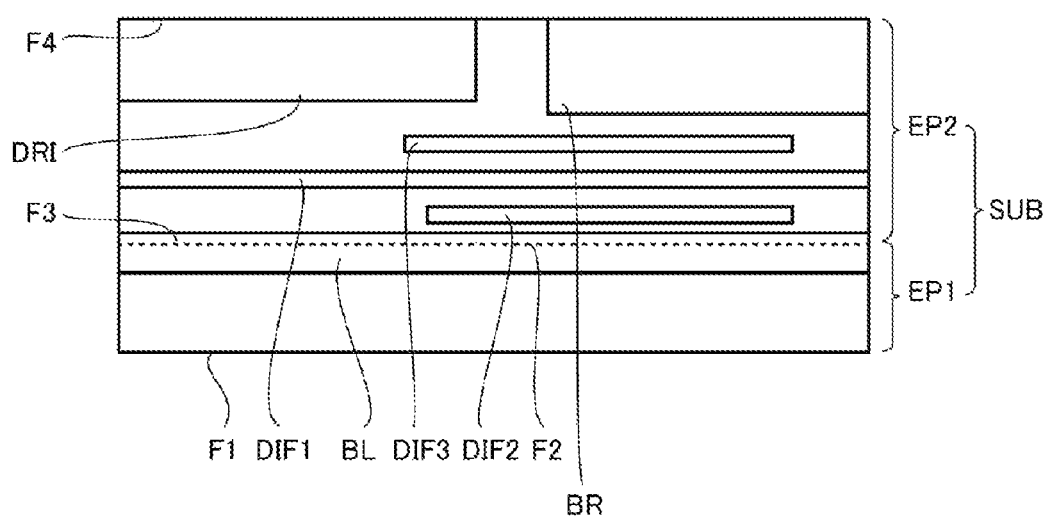
FIG. 15 is a cross-sectional view of the semiconductor device according to the first embodiment in a fifth ion implantation step S6.

As shown in FIG. 14, in the fourth ion implantation step S5, ion implantation for forming the body region BR is performed. As shown in FIG. 15, in the fifth ion implantation step S6, ion implantation for forming the drift region DRI is performed. The first ion implantation step S2 to the fifth ion implantation step S6 are performed using, for example, photoresist as a mask.

Figure 16:
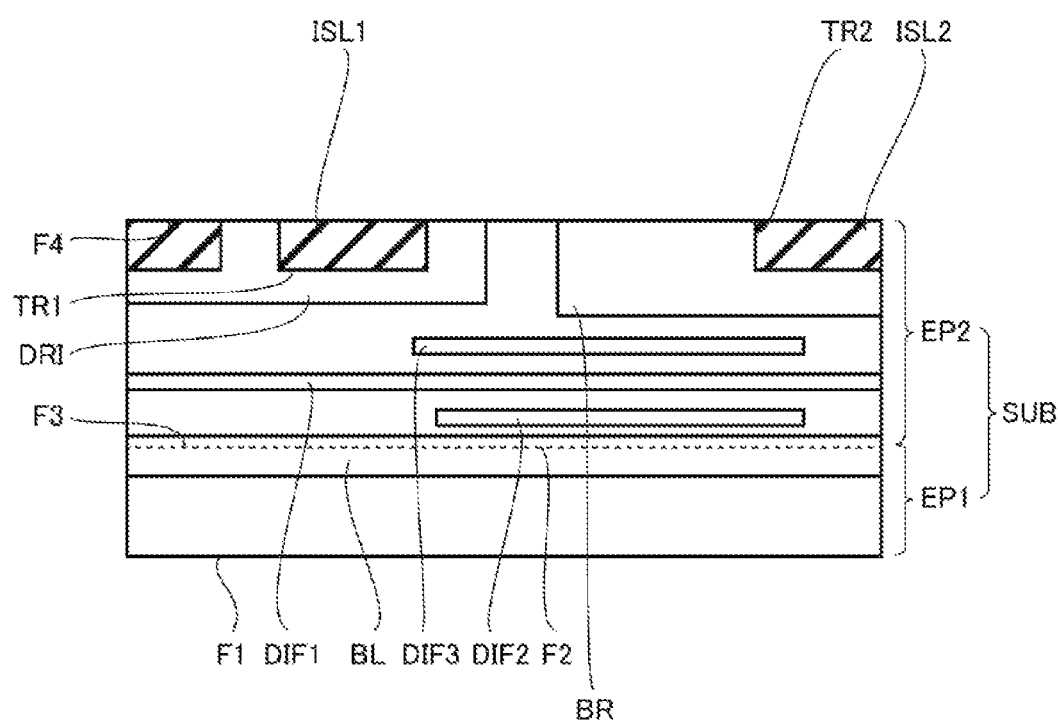
FIG. 16 is a cross-sectional view of the semiconductor device according to the first embodiment in a first insulating isolation film forming step S7.

As shown in FIG. 16, in the first insulating isolation film forming step S7, the insulating isolation film ISL1 and the insulating isolation film ISL2 are formed. In the first insulating isolation film forming step S7, first, the trench TR1 and the trench TR2 are formed. The trench TR1 and the trench TR2 are formed by anisotropic dry etching such as Reactive Ion Etching (RIE).

In the first insulating isolation film forming step S7, second, materials constituting the insulating isolation film ISL1 and the insulating isolation film ISL2 are embedded in the trench TR1 and the trench TR2. The insulating isolation film ISL1 and the materials constituting the insulating isolation film ISL2 are buried in the trench TR1 and the trench TR2 by, for example, Chemical Vapor Deposition (CVD) or the like. In the first insulating isolation film forming step S7, third, the materials constituting the insulating isolation film ISL1 and the insulating isolation film ISL2 protruding from the trench TR1 and the trench TR2 are removed by Chemical Mechanical Polishing (CMP) or the like.

Figure 17:
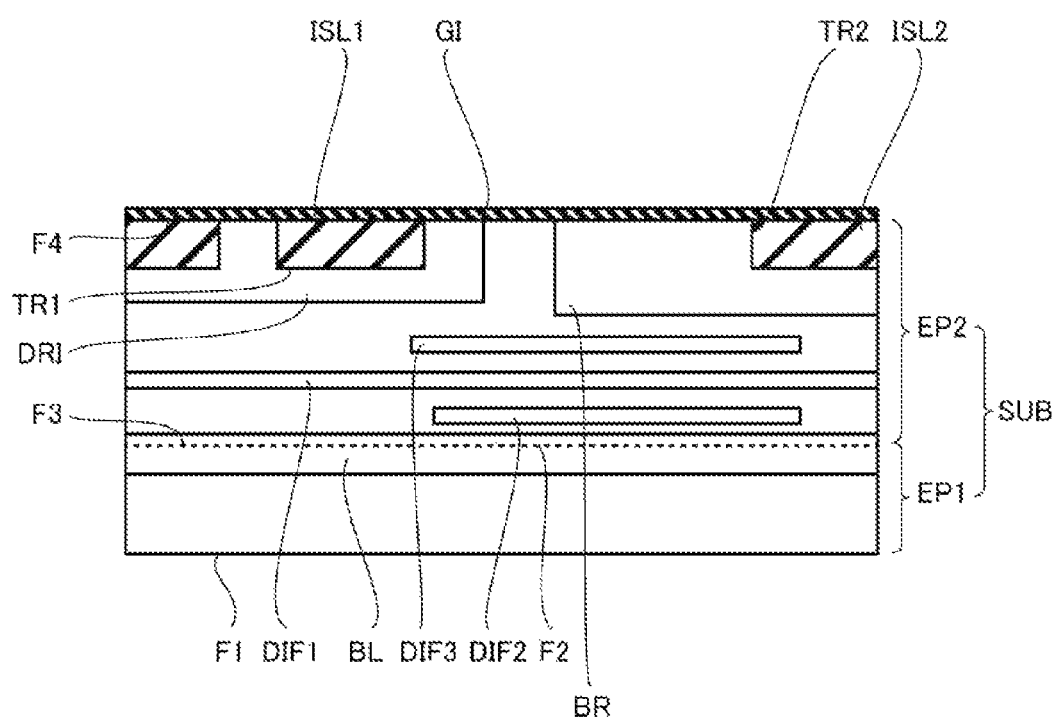
FIG. 17 is a cross-sectional view of the semiconductor device according to the first embodiment of the gate dielectric film forming step S8.

As shown in FIG. 17, in the gate dielectric film forming step S8, the gate dielectric film GI is formed. The gate dielectric film forming step S8 is performed, for example, by thermally oxidizing the fourth surface F4 of the epitaxial layer EP2.

Figure 18:
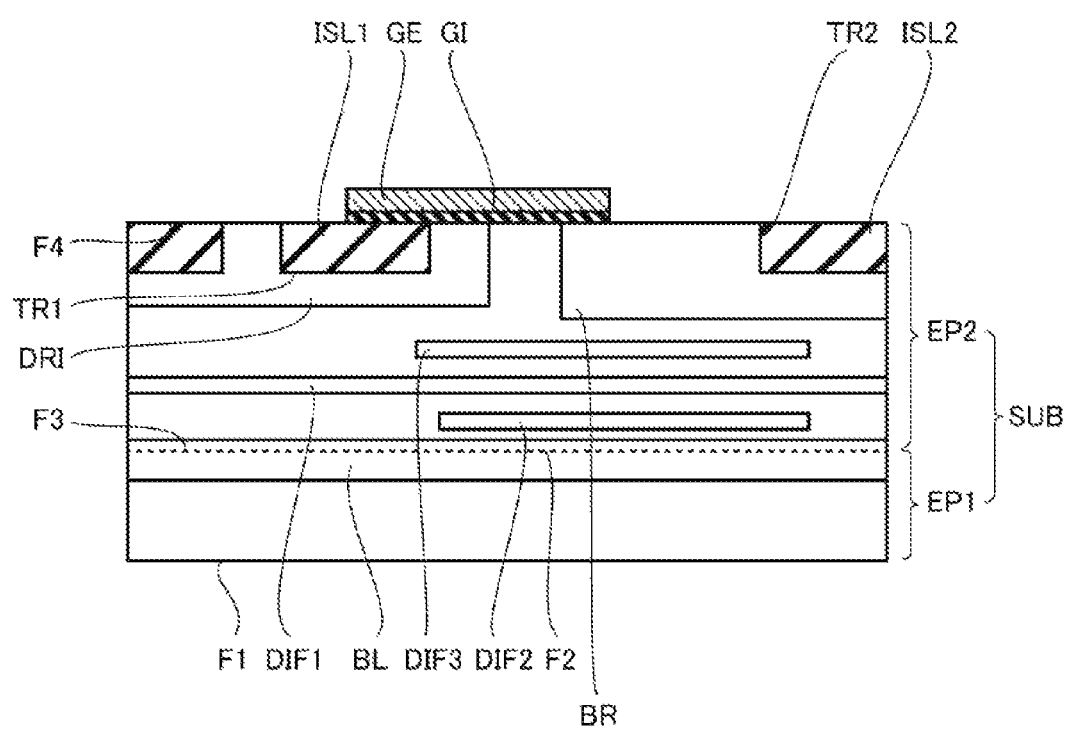
FIG. 18 is a cross-sectional view of the semiconductor device according to the first embodiment in the gate electrode forming step S9.

As shown in FIG. 18, in the gate electrode forming step S9, the gate electrode GE is formed. In the gate electrode forming step S9, first, a material constituting the gate electrode GE is deposited by CVD or the like. In the gate electrode forming step S9, second, materials constituting the formed gate electrode GE are patterned by anisotropic dry etch using photoresists formed by photolithography.

Figure 19:
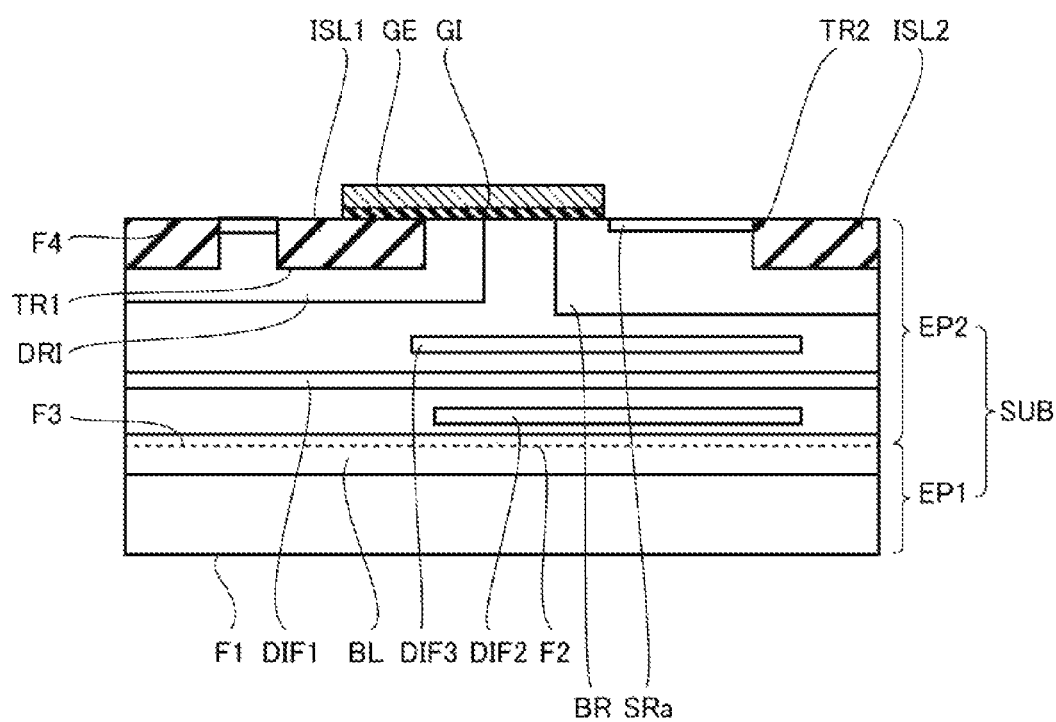
FIG. 19 is a cross-sectional view of the semiconductor device according to the first embodiment in a sixth ion implantation step S10.

As shown in FIG. 19, in the sixth ion implantation step S10, first portion SRa is formed. The sixth ion implantation step S10 is performed with the gate electrode GE as a mask.

Figure 20:
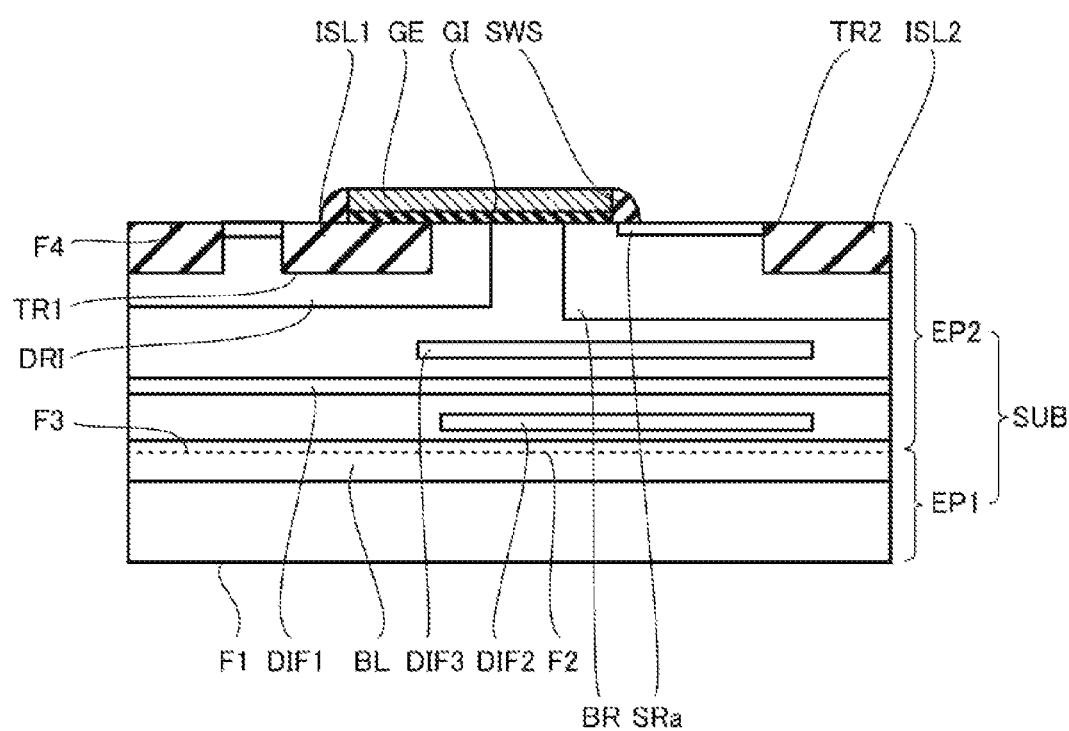
FIG. 20 is a cross-sectional view of the semiconductor device according to the first embodiment in a side wall spacer forming step S11.

As shown in FIG. 20, in the sidewall spacer forming step S11, the sidewall spacer SWS is formed. In the sidewall spacer forming step S11, first, a material constituting the sidewall spacer SWS is deposited by CVD or the like. In the sidewall spacer forming step S11, second, materials constituting the deposited sidewall spacer SWS is etched back.

Figure 21:
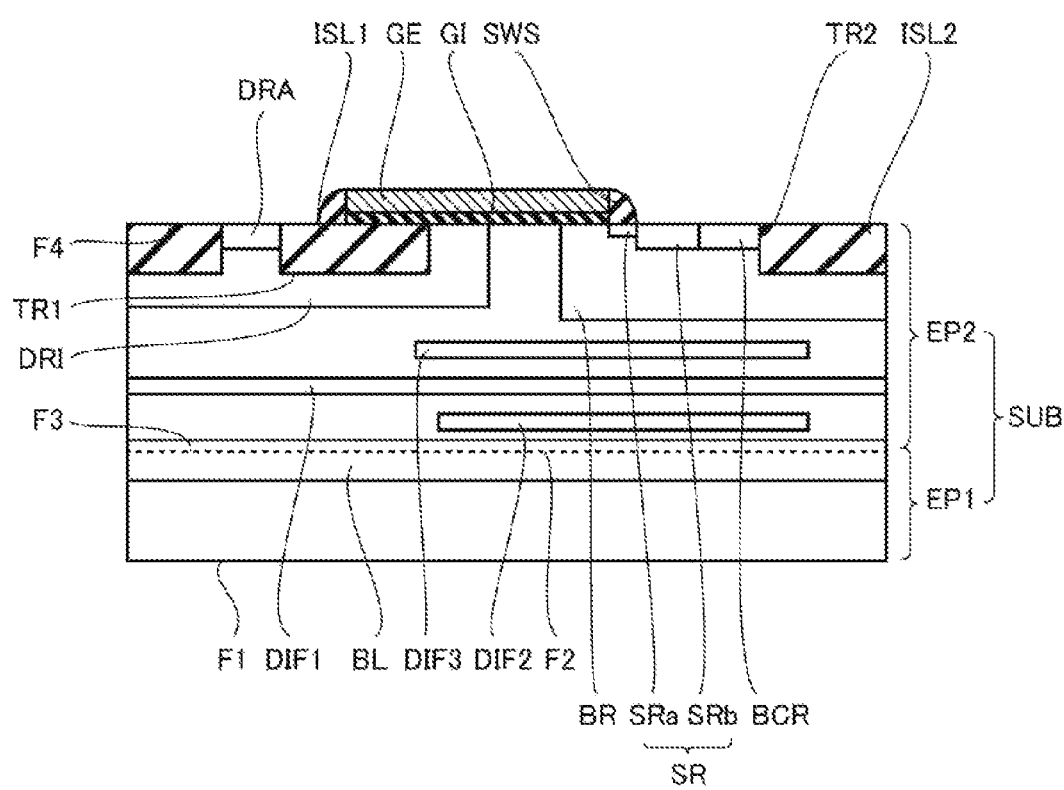
FIG. 21 is a cross-sectional view of the semiconductor device according to the first embodiment in a seventh ion implantation step S12.

As shown in FIG. 21, in the seventh ion implantation step S12, the source region SR (more specifically, the second portion SRb), the drain region DRA, and the body contact region BCR are formed. The seventh ion implantation step S12 is performed using the gate electrode GE, the sidewall spacer SWS and the photoresist as a mask.

Figure 22:
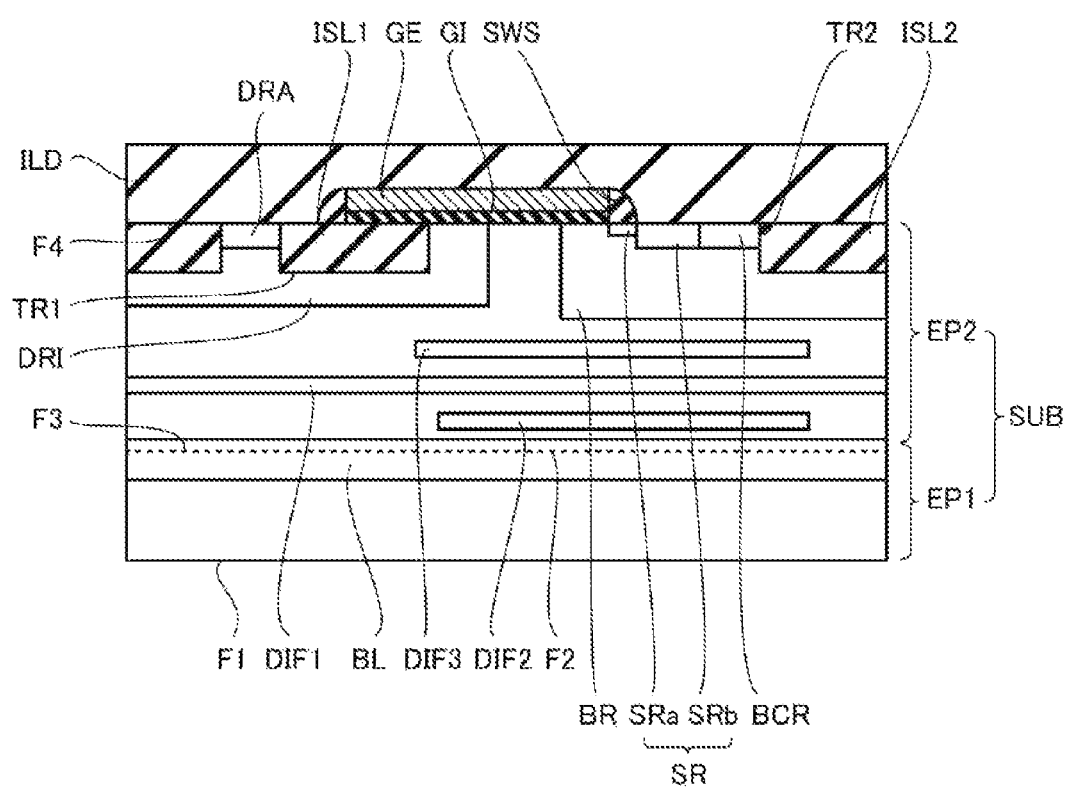
FIG. 22 is a cross-sectional view of the semiconductor device according to the first embodiment in an interlayer insulating film forming step S13.

As shown in FIG. 22, in the interlayer insulating film forming step S13, the interlayer insulating film ILD is formed. In the interlayer insulating film forming step S13, first, a materials constituting the interlayer insulating film ILD are deposited by CVD or the like. In the interlayer insulating film forming step S13, second, the materials constituting the interlayer insulating film ILDs formed by CMP or the like are planarized.

Figure 23:
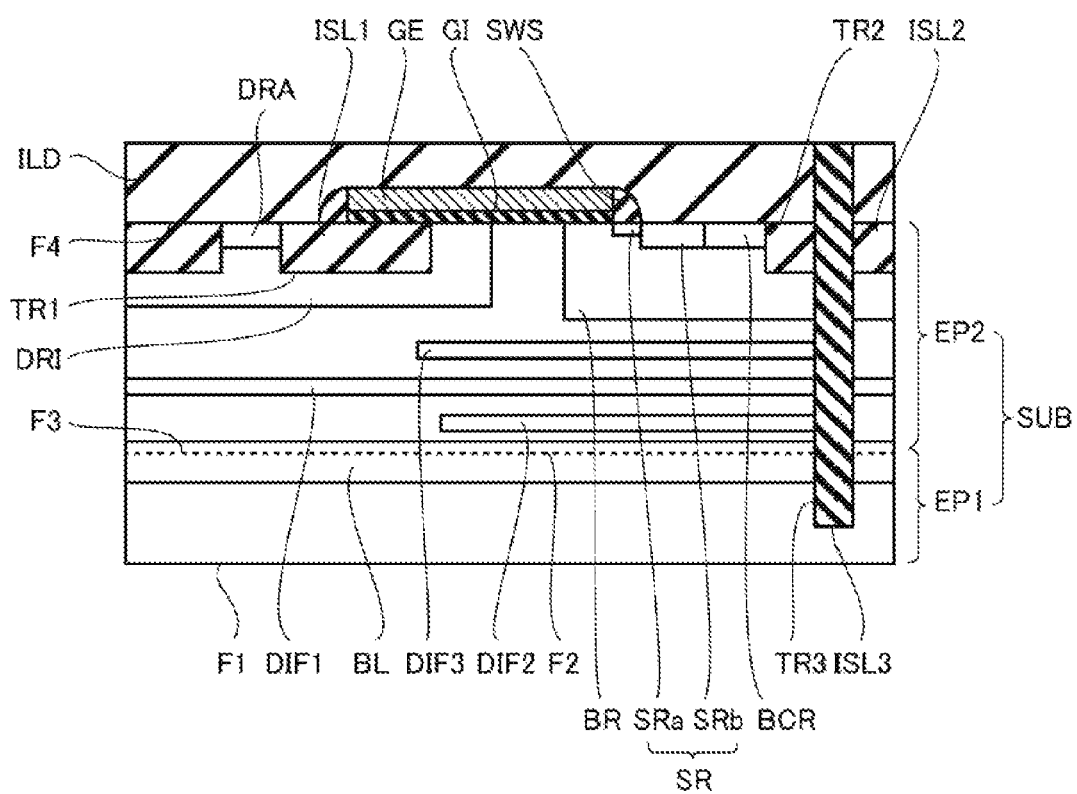
FIG. 23 is a cross-sectional view of the semiconductor device according to the first embodiment in a second insulating film forming step S14.

As shown in FIG. 23, in the second insulating isolation film forming step S14, the insulating isolation film ISL3 is formed. In the second insulating isolation film forming step S14, firstly, the trench TR3 is formed. The trench TR3 is formed by an anisotropic dry etch. In the second insulating isolation film forming step S14, second, materials constituting the insulating isolation film ISL3 are embedded in the trench TR3 by CVD or the like. In the second insulating isolation film forming step S14, third, materials constituting the insulating isolation film ISL3 protruding from the trench TR3 are removed by CMP or the like.

Figure 24:
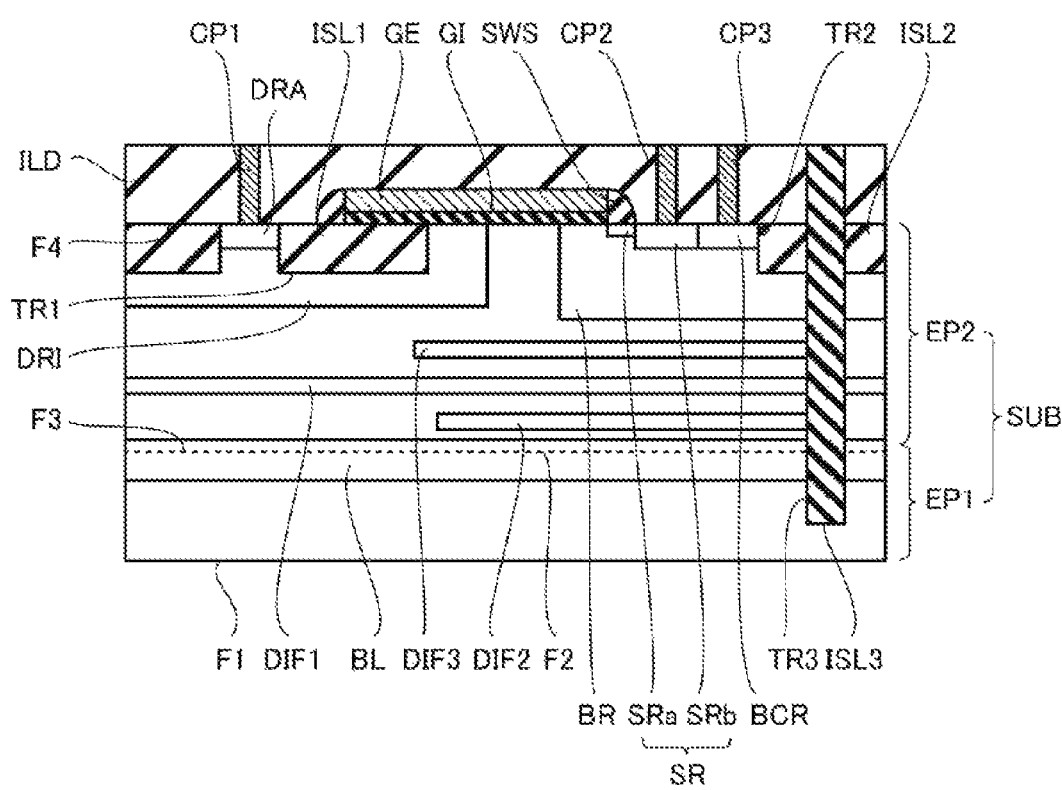
FIG. 24 is a cross-sectional view of the semiconductor device according to the first embodiment in a contact plug forming step S15.

As shown in FIG. 24, in the contact plug forming step S15, the contact plug CP1, the contact plug CP2, and the contact plug CP3 are formed. In the contact plug forming step S15, first, contact holes are formed in the interlayer insulating film ILD. The contact hole is formed by anisotropic dry etching, for example. In the contact plug forming step S15, second, materials constituting the contact plug CP1, the contact plug CP2, and the contact plug CP3 are buried in the contact hole by CVD or the like. In the contact plug forming step S15, third, the materials constituting the contact plug CP1, the contact plug CP2, and the contact plug CP3 protruding from the contact hole are removed by CMP or the like.

In the wiring forming step S16, formation of wiring WL1 and wiring WL2 is performed. In the wiring forming step S16, first, materials constituting the wiring WL1 and the wiring WL2 are deposited by sputtering or the like. In the wiring forming step S16, second, materials constituting the deposited wiring WL1 and wiring WL2 are patterned by anisotropic dry etch using photoresists formed by photolithography. As described above, the semiconductor device according to the first embodiment shown in FIG. 3 is formed.

As described above, in the semiconductor device according to the first embodiment, the first region DIF1 is formed below at least the drain region DRA, and the impurity concentration of the first region DIF1 is small. Therefore, when a positive potential is applied to the drain region DRA, punch-through is likely to occur between the drift region DRI and the buried region BL. When a gap between the drift region DRI and the buried region BL is punched through, the potential applied to the drain region DRA is shared by the drain region DRA, the drift region DRI, and the buried region BL, and therefore, the semiconductor device according to the first embodiment can improve the off-state withstand voltage.

In the semiconductor device according to the first embodiment, the potential applied to the drain region DRA by punch-through between the drift region DRI and the buried region BL is also shared by the buried region BL, and as a result, the potential of the buried region BL tends to rise. When the potential of the buried region BL rises, a depletion layer tends to extend from the buried region BL to the body region BR, and the potential of the body region BR tends to rise.

The semiconductor device according to the first embodiment includes a parasitic npn transistor having the drain region DRA as a collector, the body region BR as a base, and the source region SR as an emitter. Therefore, if the potential of the body region BR rises, the parasitic npn transistor operates, and the on-state breakdown voltage may decrease.

However, as described above, the semiconductor device according to the first embodiment includes the second region DIF2 extending such that the second end DIF2b reaches below at least the source region SR. Since the second region DIF2 has a high impurity concentration and is disposed close to the buried region BL, the depletion layer hardly extends from the buried region BL to the body region BR even if the potential of the buried region BL rises. That is, in the semiconductor device according to the first embodiment, the potential of the body region BR is hardly raised, and a decrease in the on-state breakdown voltage is suppressed.

Figure 25:
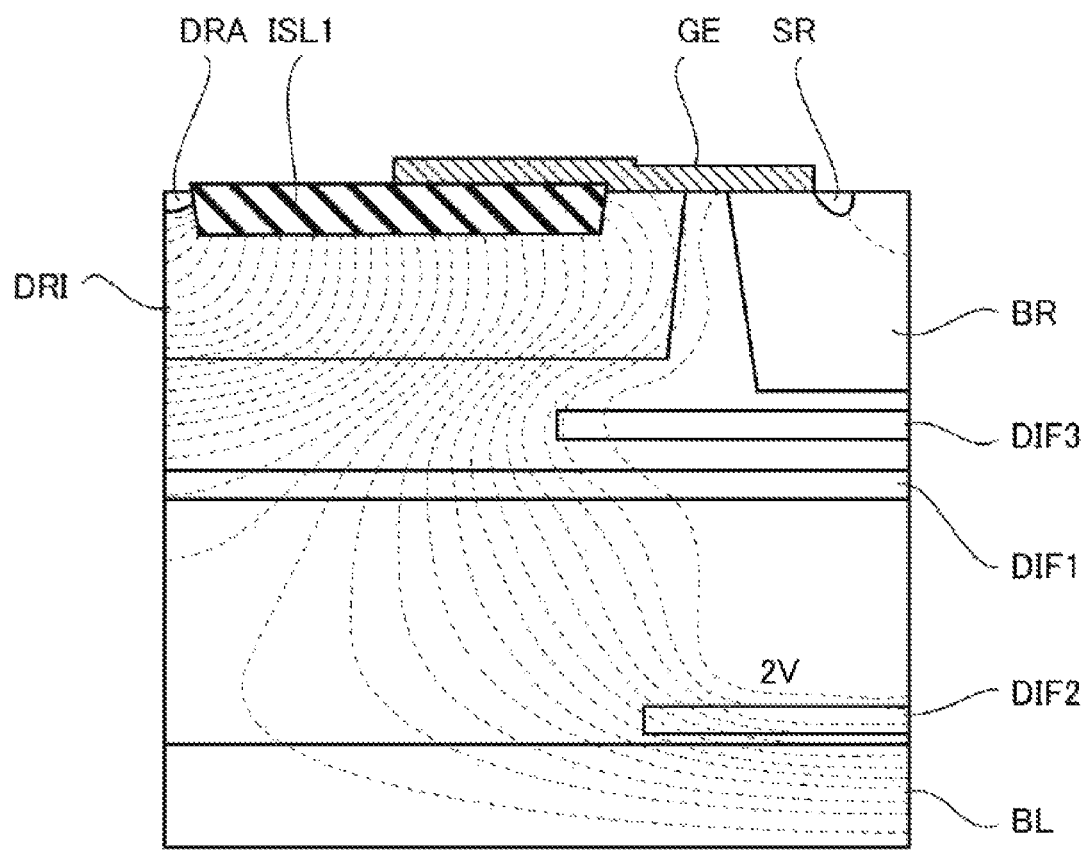
FIG. 25 is an explanatory diagram of the simulation when a second region DIF2 is formed.
Figure 26:
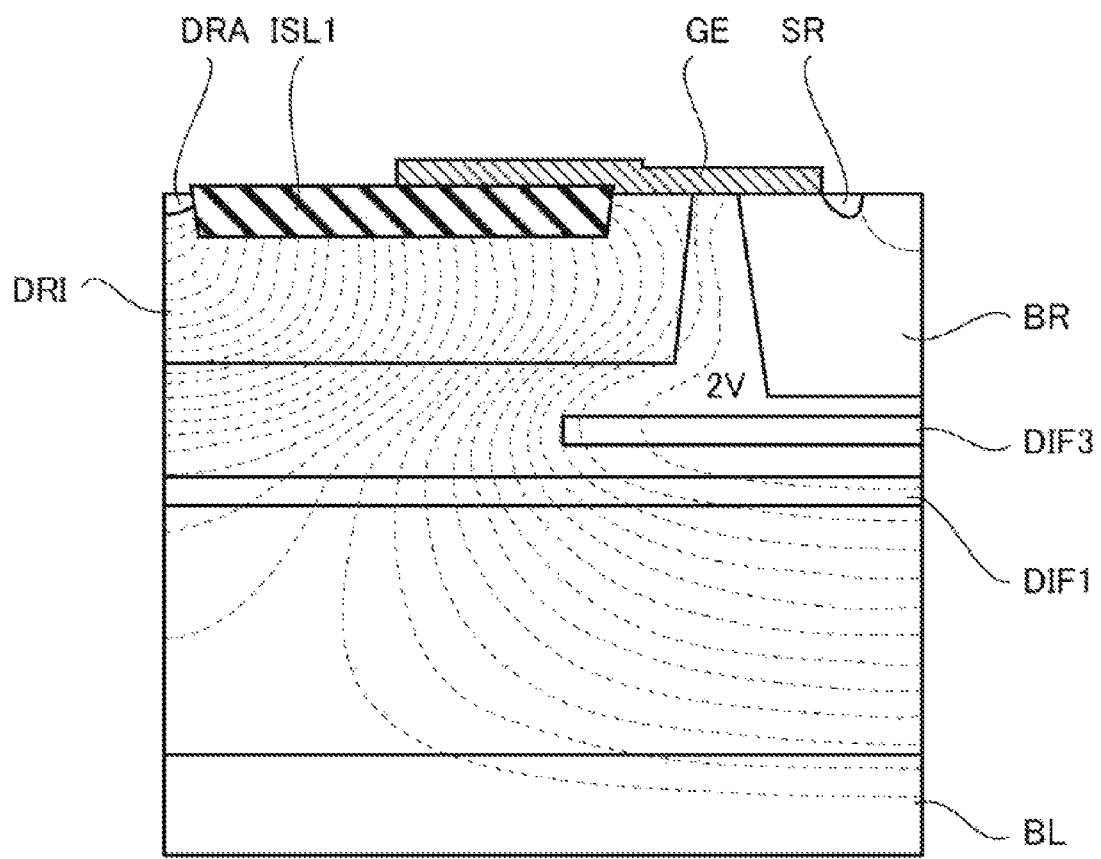
FIG. 26 is an explanatory diagram of the simulation when a second region DIF2 is not formed.

FIG. 25 shows a simulation result by Technology CAD (TCAD) when the second region DIF2 is formed, and FIG. 26 shows a simulation result by TCAD when the second region DIF2 is not formed. In FIGS. 25 and 26, equipotential lines are indicated by dotted lines at 2V intervals. In these simulations, the potential applied to the drain region DRA was set to 70 V, and the potential applied to the gate electrode GE was set to 4 V.

As shown in FIGS. 25 and 26, when the second region DIF2 is not formed, the potential of the body region BR is raised by the potential of the buried region BL, while, when the second region DIF2 is formed, the rise of the potential of the body region BR due to the potential of the buried region BL is suppressed.

Since the first end of the second region DIF2 is disposed between the body region BR and the drain region DRA in the channel length direction (i.e., is formed so as to avoid the lower portion of the drain region DRA), the off-state breakdown voltage can be maintained without preventing punch-through between the drift region DRI and the buried region BL when a positive potential is applied to the drain region DRA.

In the semiconductor device according to the first embodiment, since the first region DIF1 is formed below at least the drain region DRA, when a negative potential is applied to the drain region DRA, punch-through between the drift region and the buried region BL is difficult. Therefore, according to the semiconductor device of the first embodiment, it is possible to improve the negative input breakdown voltage.

The semiconductor device according to the first embodiment also includes the parasitic npn transistor including the buried region BL as a collector, the body region BR as a bases, and the source region SR as an emitter. In the semiconductor device according to the first embodiment, since the parasitic npn transistor is hardly operated by suppressing the potential rise of the body region BR, substrate injection is hardly caused, and leakage current when the body diode is intentionally operated can be reduced.

In the semiconductor device according to the first embodiment, even if the impurity concentration of the drift region DRI is increased, or even if the impurity concentration of the drift region DRI is increased due to the REduced SUrface Field (RESURF) effect of the third region DIF3, the drift region DRI is easily depleted. That is, in the semiconductor device according to the first embodiment, the on-resistance can be lowered while maintaining the off-withstand voltage of the transistor Tr.

A conductivity near the side surface of the trench TR3 is the first conductivity type. It is considered that this is caused by deposits caused by the etching of the buried region BL adhering to the side surfaces of the trench TR3 when the etching of the buried region BL is performed in the second insulating isolation film forming step S14. In the semiconductor device according to the first embodiment, since the first region DIF1, the second region DIF2 and the third region DIF3 extend such that the first region DIF1, the second region DIF2 and the third region DIF3 contact with the side surface of the trench TR3, it is possible to suppress a decrease in negative input breakdown voltage caused by punch-through between the drift region DRI and the side surface of the trench TR3.

In the semiconductor device according to the first embodiment, when substrate injection occurs from a region other than the region in which the transistor Tr is formed, electrons are annihilated by recombination in the second region DIF2 at the deepest position, and are also annihilated by recombination in the first region DIF1 and the third region DIF3. Therefore, in the semiconductor device according to the first embodiment, it is possible to reduce the effect of substrate injection from regions other than regions where the transistors Tr are formed.

In the semiconductor device according to the first embodiment, since the second region DIF2 contacts with the trench TR3 and is located in the vicinity of the buried region BL, it is possible to suppress an increase in the potential of the buried region BL located in the vicinity of the trench TR3. As a result, according to the semiconductor device of the first embodiment, a reliability of the insulating isolation film ISL3 can be improved.

Second Embodiment

Hereinafter, a semiconductor device according to a second embodiment will be described. Here, the difference from the semiconductor device according to the first embodiment will be mainly described, and the description will not be repeated.

Configuration of Semiconductor Device According to Second Embodiment

A semiconductor device according to the second embodiment includes: a semiconductor substrate SUB; an insulating isolation film ISL1 and an insulating isolation film ISL2; a gate dielectric film GI; a gate electrode GE; a sidewall spacer SWS; an interlayer insulating film ILD; an insulating isolation film ISL3; a contact plug CP1; a contact plug CP2; a contact plug CP3; a wiring WL1; and a wiring WL2. The semiconductor substrate SUB includes an epitaxial layer EP1, an epitaxial layer EP2, and a buried region BL.

The epitaxial layer EP2 includes a drain region DRA, a source region SR, a drift region DRI, a body region BR, a body contact region BCR, a first region DIF1, a second region DIF2, and a third region DIF3. In these respects, the semiconductor device according to the second embodiment is similar to the configuration of the semiconductor device according to the first embodiment.

Figure 27:
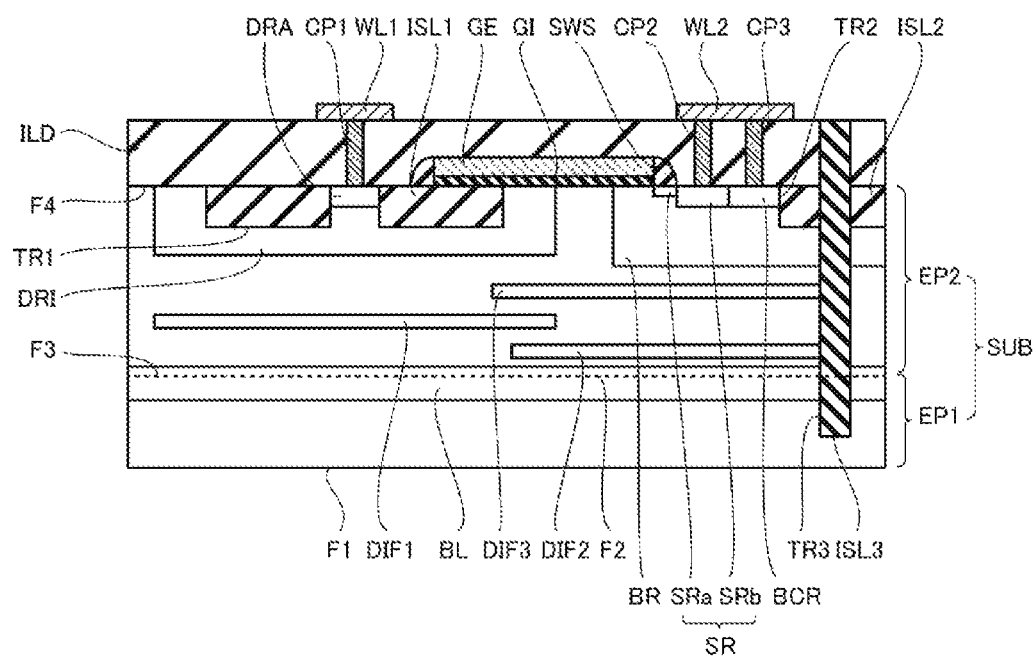
FIG. 27 is a cross-sectional view of a semiconductor device according to a second embodiment.

However, in the semiconductor device according to the second embodiment, as shown in FIG. 27, both end positions of the first region DIF1 in the channel length direction are formed to coincide with both end positions of the drift region DRI in the channel length direction. In this respect, the configuration of the semiconductor device according to second embodiment differs from the configuration of the semiconductor device according to the first embodiment.

Method of Manufacturing Semiconductor Device According to Second Embodiment

Figure 28:
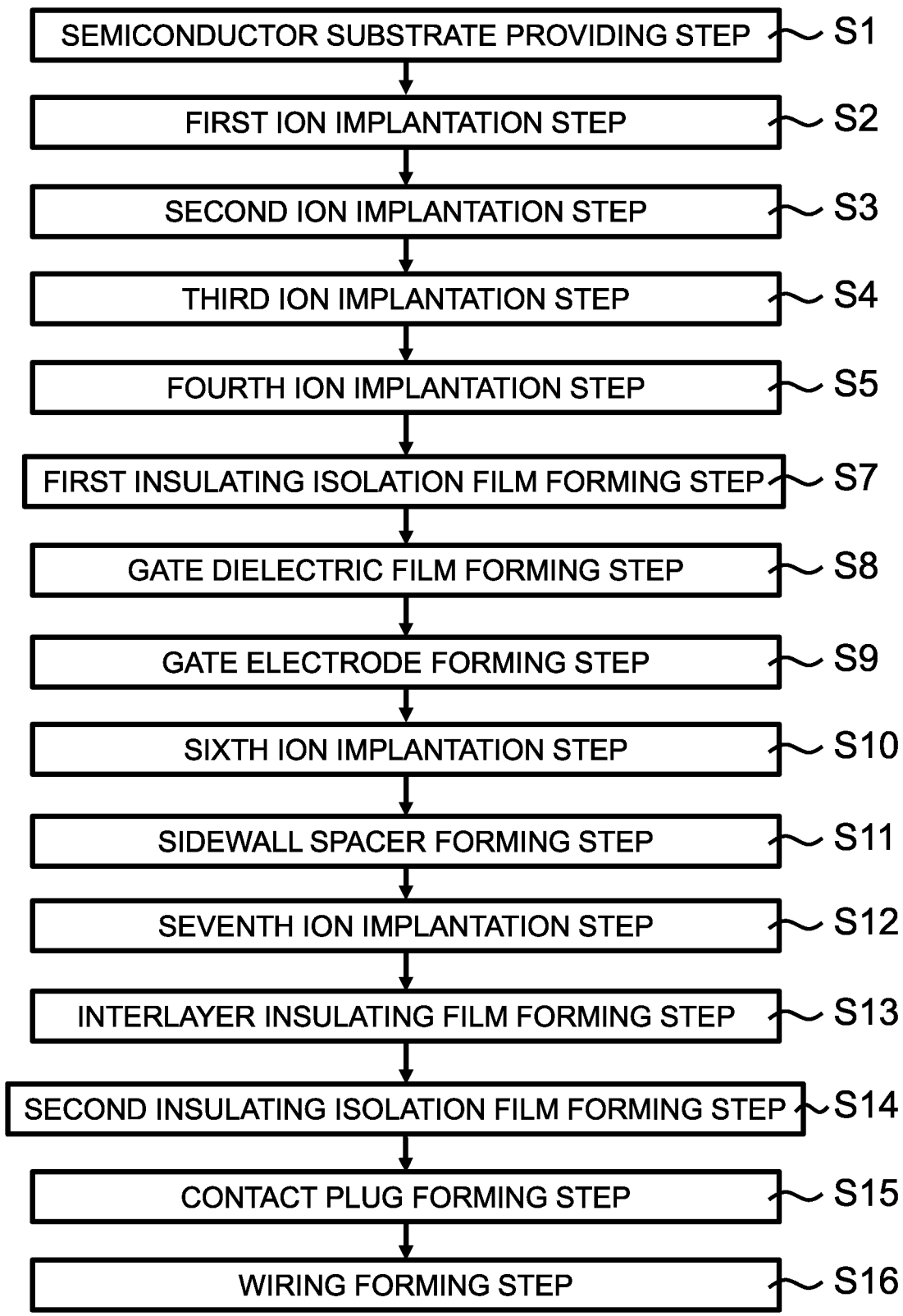
FIG. 28 is a process diagram showing the method of manufacturing the semiconductor device according to the second embodiment.

As shown in FIG. 28, the method of manufacturing the semiconductor device according to the second embodiment includes a semiconductor substrate providing step S1, a first ion implantation step S2, a second ion implantation step S3, a third ion implantation step S4, a fourth ion implantation step S5, a first insulating isolation film forming step S7, a gate dielectric film forming step S8, and a gate electrode forming step S9. The method of manufacturing the semiconductor device according to second embodiment further includes a sixth ion implantation step S10, a sidewall spacer forming step S11, a seventh ion implantation step S12, an interlayer insulating film forming step S13, a second insulating isolation film forming step S14, a contact plug forming step S15, and a wiring forming step S16. In these respects, the method of manufacturing the semiconductor device according to the second embodiment differs from the method of manufacturing the semiconductor device according to the first embodiment.

However, the method of manufacturing the semiconductor device according to the second embodiment differs from the method of manufacturing the semiconductor device according to the first embodiment in that the method of manufacturing the semiconductor device according to the second embodiment does not includes the fifth ion implantation step S6. In the semiconductor device according to the second embodiment, since both end positions of the first region DIF1 in the channel length direction coincide with both end positions of the drift region DRI in the channel length direction, the first region DIF1 and the drift region DRI are formed using the same masks by changing the implantation depth and the type of ions to be implanted in the second ion implantation step S3.

Effects of Semiconductor Device According to Second Embodiment

In the semiconductor device according to the second embodiment, the first region DIF1 and drift region DRI, because it is possible to form by ion implantation using the same mask, it is possible to simplify the manufacturing process.

Third Embodiment

Hereinafter, a semiconductor device according to third embodiment will be described. Here, the difference from the semiconductor device according to the first embodiment will be mainly described, and the description will not be repeated.

Configuration of Semiconductor Device According to Third Embodiment

A semiconductor device according to a third embodiment includes: a semiconductor substrate SUB; an insulating isolation film ISL1 and an insulating isolation film ISL2; a gate dielectric film GI; a gate electrode GE; a sidewall spacer SWS; an interlayer insulating film ILD; an insulating isolation film ISL3; a contact plug CP1; a contact plug CP2; a contact plug CP3; a wiring WL1; and a wiring WL 2. The semiconductor substrate SUB has an epitaxial layer EP1 and an epitaxial layer EP2 in the semiconductor substrate SUB. The epitaxial layer EP1 has a buried region BL.

The epitaxial layer EP2 includes a drain region DRA, a source region SR, a drift region DRI, a body region BR, a body contact region BCR, a first region DIF1, a second region DIF2, and a third region DIF3. In these respects, the semiconductor device according to third embodiment is similar to the configuration of the semiconductor device according to the first embodiment.

Figure 29:
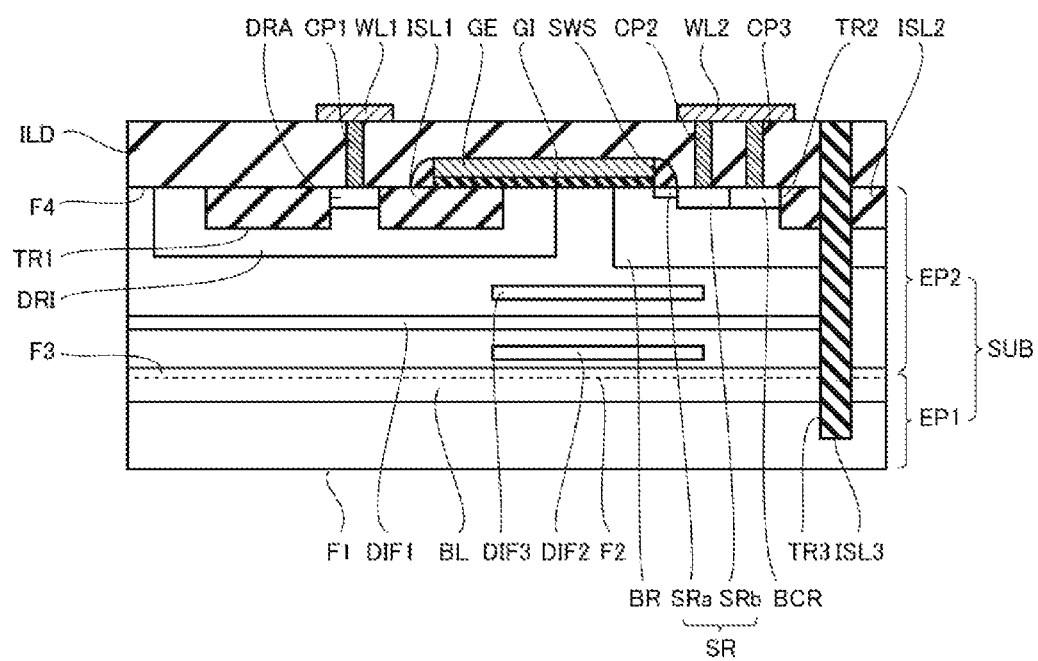
FIG. 29 is a cross-sectional view of a semiconductor device according to a third embodiment.

However, in the semiconductor device according to third embodiment, as shown in FIG. 29, both end positions of the second region DIF2 in the channel length direction are formed to coincide with both end positions of the third region DIF3 in the channel length direction. In this regard, the configuration of the semiconductor device according to third embodiment differs from the configuration of the semiconductor device according to the first embodiment.

Method of Manufacturing Semiconductor Device According to Third Embodiment

Figure 30:
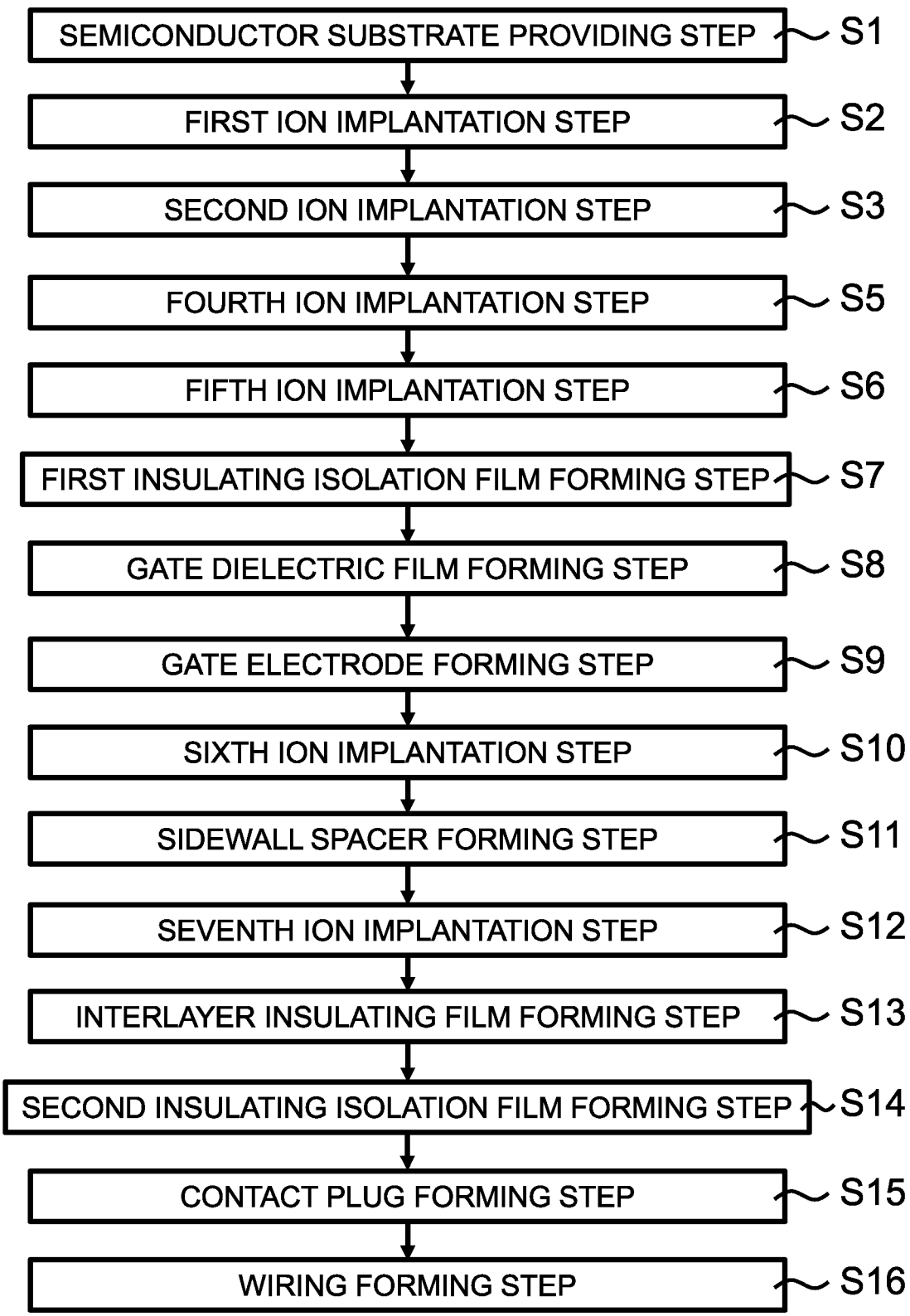
FIG. 30 is a process diagram showing a method of manufacturing the semiconductor device according to the third embodiment.

As shown in FIG. 30, the method of manufacturing the semiconductor device according to the third embodiment includes a semiconductor substrate providing step S1, a first ion implantation step S2, a second ion implantation step S3, a fourth ion implantation step S5, a fifth ion implantation step S6, a first insulating isolation film forming step S7, a gate dielectric film forming step S8, and a gate electrode forming step S9. The method of manufacturing the semiconductor device according to third embodiment further includes a sixth ion implantation step S10, a sidewall spacer forming step S11, a seventh ion implantation step S12, an interlayer insulating film forming step S13, a second insulating isolation film forming step S14, a contact plug forming step S15, and a wiring forming step S16. In these respects, the method of manufacturing the semiconductor device according to the third embodiment differs from the method of manufacturing the semiconductor device according to the first embodiment.

However, the method of manufacturing the semiconductor device according to the third embodiment differs from the method of manufacturing the semiconductor device according to the first embodiment in that the method of manufacturing the semiconductor device according to the third embodiment does not include the third ion implantation step S4. In the semiconductor device according to the third embodiment, since the both end positions of the second region DIF2 in the channel length direction coincide with the both end positions of the third region DIF3 in the channel length direction, the second region DIF2 and the third region third are formed using the same masks by changing the implantation depth in the first ion implantation step S2.

Effects of Semiconductor Device According to Third Embodiment

In the semiconductor device according to the third embodiment, by ion implantation using the same mask, it is possible to form a second region DIF2 and third region DIF3, it is possible to simplify the manufacturing process.

Although the invention made by the present inventor has been specifically described based on the embodiments, the present invention is not limited to the embodiment described above, and various modifications can be made without departing from the gist thereof.

What is claimed is:
1. A semiconductor device comprising:
   a semiconductor substrate including:
      a first epitaxial layer having a first conductivity type and having:
         a first surface; and
         a second surface opposite to the first surface;
      a second epitaxial layer having the first conductivity type, and formed on the second surface, the second epitaxial layer having:
         a third surface facing the second surface; and
         a fourth surface opposite to the third surface; and
      a buried region having a second conductivity type opposite to the first conductivity type, and formed across the first epitaxial layer and the second epitaxial layer; and
      a gate electrode,
   wherein the second epitaxial layer comprises:
      a drain region having the second conductivity type, and formed on the fourth surface;
      a source region having the second conductivity type, formed on the fourth surface, and spaced apart from the drain region;
      a drift region having the second conductivity type, and formed on the fourth surface such that the drift region surrounds the drain region;

a body region having the first conductivity type, and formed on the fourth surface such that the body region surrounds the source region;

a first region having the first conductivity type, and formed at a position closer to the buried region than the drift region in a thickness direction extending from the third surface toward the fourth surface; and a second region having the first conductivity type, and formed at a position closer to the buried region than the first region in the thickness direction, wherein the first region is formed below at least the drain region, wherein the second region has a first end and a second end opposite to the first end in a channel length direction extending from the source region to the drain region, wherein the first end is located between the body region and the drain region in the channel length direction, wherein the second region extends from the first end to the second end such that the second end reaches below at least the source region, wherein an impurity concentration of the second region is greater than an impurity concentration of the first region, and wherein the gate electrode faces the fourth surface between the source region and the drift region, while the gate electrode is insulated.

2. The semiconductor device according to claim 1,
wherein a trench is formed in the semiconductor substrate such that the trench extends from the fourth surface toward the first surface,
wherein the body region and the buried region are exposed from a sidewall of the trench, and
wherein the second region extends from the first end such that the second end reaches the trench.

3. The semiconductor device according to claim 2,
wherein the first region extends from below the drain region such that the first region reaches the trench.

4. The semiconductor device according to claim 2,
wherein the first region is formed such that both end positions of the first region in the channel length direction respectively coincide with both end positions of the drift region in the channel length direction.

5. The semiconductor device according to claim 1,
wherein the second epitaxial layer includes a third region having the second conductivity type,
wherein the third region is formed closer to the buried region than the drift region in the thickness direction and farther from the buried region than the first region in the thickness direction,
wherein the third region has a third end and a fourth end opposite to the third end in the channel length direction,
wherein the third end is positioned between the body region and the drain region in the channel length direction,
wherein the third region extends from the third end toward the fourth end such that the fourth end reaches below at least the source region, and
wherein an impurity concentration of the third region is greater than the impurity concentration of the first region.

6. The semiconductor device according to claim 5,
wherein a trench is formed in the semiconductor substrate such that the trench extends from the fourth surface toward the first surface,
wherein the body region and the buried region are exposed from a sidewall of the trench, and wherein the third region extends such that the third region reaches the trench.

7. The semiconductor device according to claim 5,
wherein the third region is formed such that both end positions of the third region in the channel length direction respectively coincide with both end positions of the second region in the channel length direction.

8. A method of manufacturing a semiconductor device, comprising:
providing a semiconductor substrate including:
a first epitaxial layer having a first conductivity type, and having:
a first surface; and
a second surface opposite to the first surface;
a second epitaxial layer having the first conductivity type, and having:
a third surface formed on the second surface, and facing the second surface; and
a fourth surface opposite to the third surface; and
a buried region having a second conductivity type opposite to the first conductivity type, and formed across the first epitaxial layer and the second epitaxial layer;

forming a drain region having the second conductivity type on the fourth surface;

forming a source region having the second conductivity type on the fourth surface, and spaced apart from the drain region;

forming a drift region having the second conductivity type on the fourth surface so as to surround the drain region;

forming a body region having the first conductivity type on the fourth surface so as to surround the source region;

forming a first region having the first conductivity type at a position closer to the buried region than the drift region in a thickness direction from the third surface toward the fourth surface;

forming a second region having the first conductivity type at a position closer to the buried region than the first region in the thickness direction; and forming a gate electrode, wherein the first region is formed below at least the drain region, wherein the second region has a first end and a second end opposite to the first end in a channel length direction from the source region toward the drain region, wherein the first end is located between the body region and the drain region in the channel length direction, wherein the second region is located from the first end to the second end so that the second end reaches below the source region, and wherein an impurity concentration of the second region is greater than an impurity concentration of the first region.

9. The method of manufacturing a semiconductor device according to claim 8,
wherein the drift region and the first region are formed by ion implantation using the same mask.

10. The method of manufacturing a semiconductor device according to claim 8, comprising:
forming a third region having the second conductivity type at a position closer to the buried region than the drift region in the thickness direction and further spaced away from the buried region in the thickness direction than the first region, wherein the third region has a third end and a fourth end which opposite to the third end in the channel length direction, wherein the third end is positioned between the body region and the drain region in the channel length direction, wherein the third region extends from the third end toward the fourth end such that the fourth end reaches below at least the source region, wherein an impurity concentration of the third region is greater than the impurity concentration of the first region, and wherein the second region and the third region are formed by ion implantation using the same mask.

* * * * *